(12) United States Patent
Ellis-Monaghan et al.

(10) Patent No.: US 8,492,807 B2
(45) Date of Patent: Jul. 23, 2013

(54) MICRO-ELECTRO-MECHANICAL SYSTEM TILTABLE LENS

(75) Inventors: John J. Ellis-Monaghan, Grand Isle, VT (US); Jeffrey P. Gambino, Westford, VT (US); Kirk D. Peterson, Jericho, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 897 days.

(21) Appl. No.: 12/632,040

(22) Filed: Dec. 7, 2009

(65) Prior Publication Data

US 2011/0134504 A1 Jun. 9, 2011

(51) Int. Cl.
*H01L 31/062* (2006.01)

(52) U.S. Cl.
USPC .............. 257/294; 257/290; 257/E31.121

(58) Field of Classification Search
USPC .............. 257/290–294, E31.117, E31.119, 257/E31.121
See application file for complete search history.

(56) References Cited

U.S. PATENT DOCUMENTS

| | | | |
|---|---|---|---|
| 7,095,548 | B1 | 8/2006 | Cho et al. |
| 7,339,746 | B2 | 3/2008 | Kim et al. |
| 8,027,077 | B2 * | 9/2011 | Border .................. 359/224.1 |
| 2006/0181780 | A1 | 8/2006 | Raber |
| 2007/0040924 | A1 | 2/2007 | Cho et al. |
| 2009/0086331 | A1 * | 4/2009 | Gunasekaran et al. ....... 359/666 |

FOREIGN PATENT DOCUMENTS

JP 10010459 1/1998

OTHER PUBLICATIONS

Veljko Milanovic, Multilevel Beam SOI-MEMS Fabrication Applications, Feb. 2004, Journal of Microelectromechanical Systems, vol. 13, No. 1, pp. 19-30.*
Milanovic, "Multilevel Beam SOI-MEMS Fabrication and Applications", Journal of Microelectromechanical Systems, vol. 13, No. 1, Feb. 2004, IEEE.

* cited by examiner

*Primary Examiner* — Matthew E Warren
(74) *Attorney, Agent, or Firm* — Scully, Scott, Murphy & Presser, P.C.; Anthony J. Canale

(57) ABSTRACT

A tiltable micro-electro-mechanical (MEMS) system lens comprises a microscopic lens located on a front surface of a semiconductor-on-insulator (SOI) substrate and a semiconductor rim surrounding the periphery of the microscopic lens. Two horizontal semiconductor beams located at different heights are provided within a top semiconductor layer. The microscopic lens may be tilted by applying an electrical bias between the lens rim and one of the two semiconductor beams, thereby altering the path of an optical beam through the microscopic lens. An array of tiltable microscopic lenses may be employed to form a composite lens having a variable focal length may be formed. A design structure for such a tiltable MEMS lens is also provided.

9 Claims, 23 Drawing Sheets

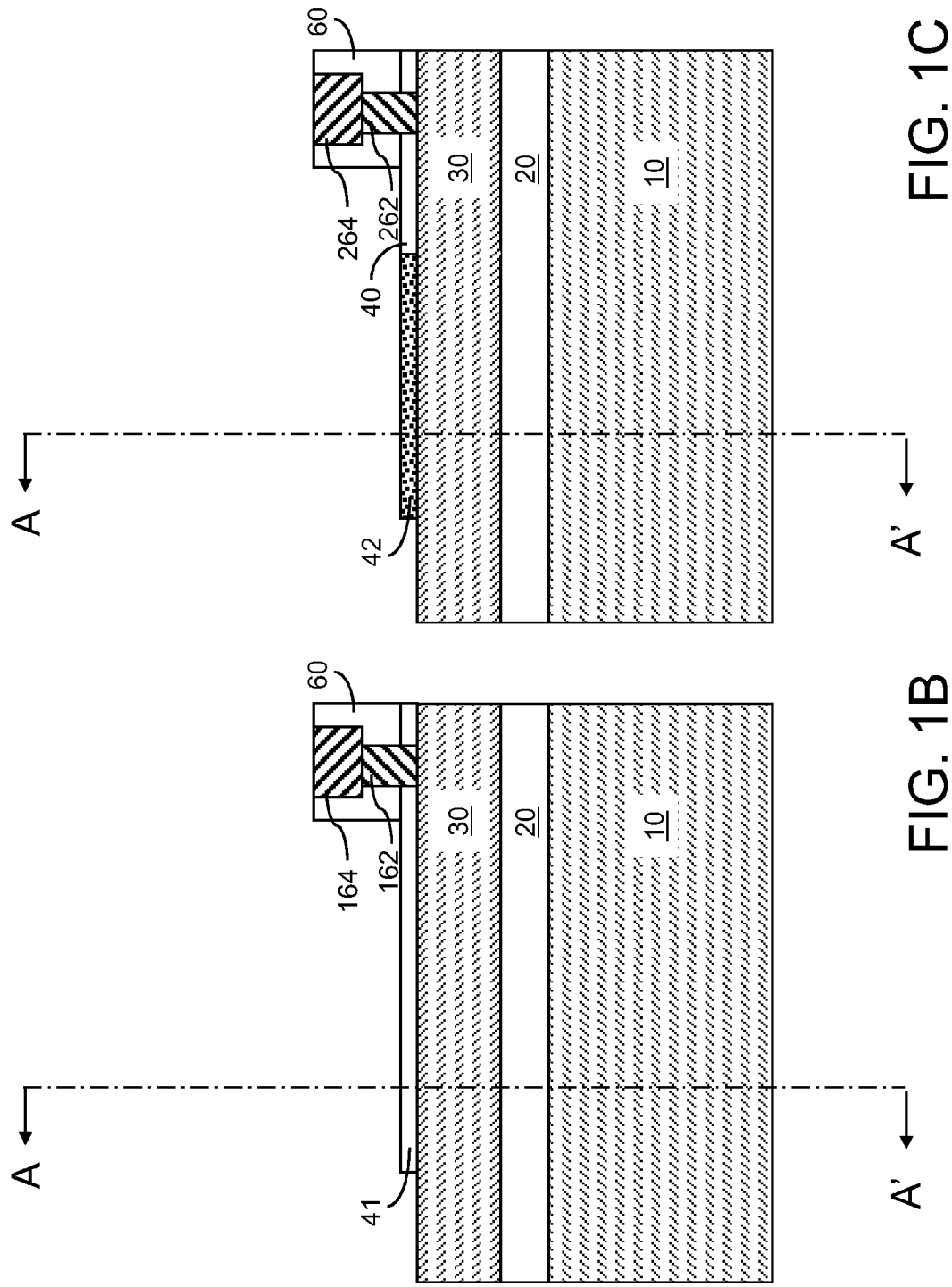

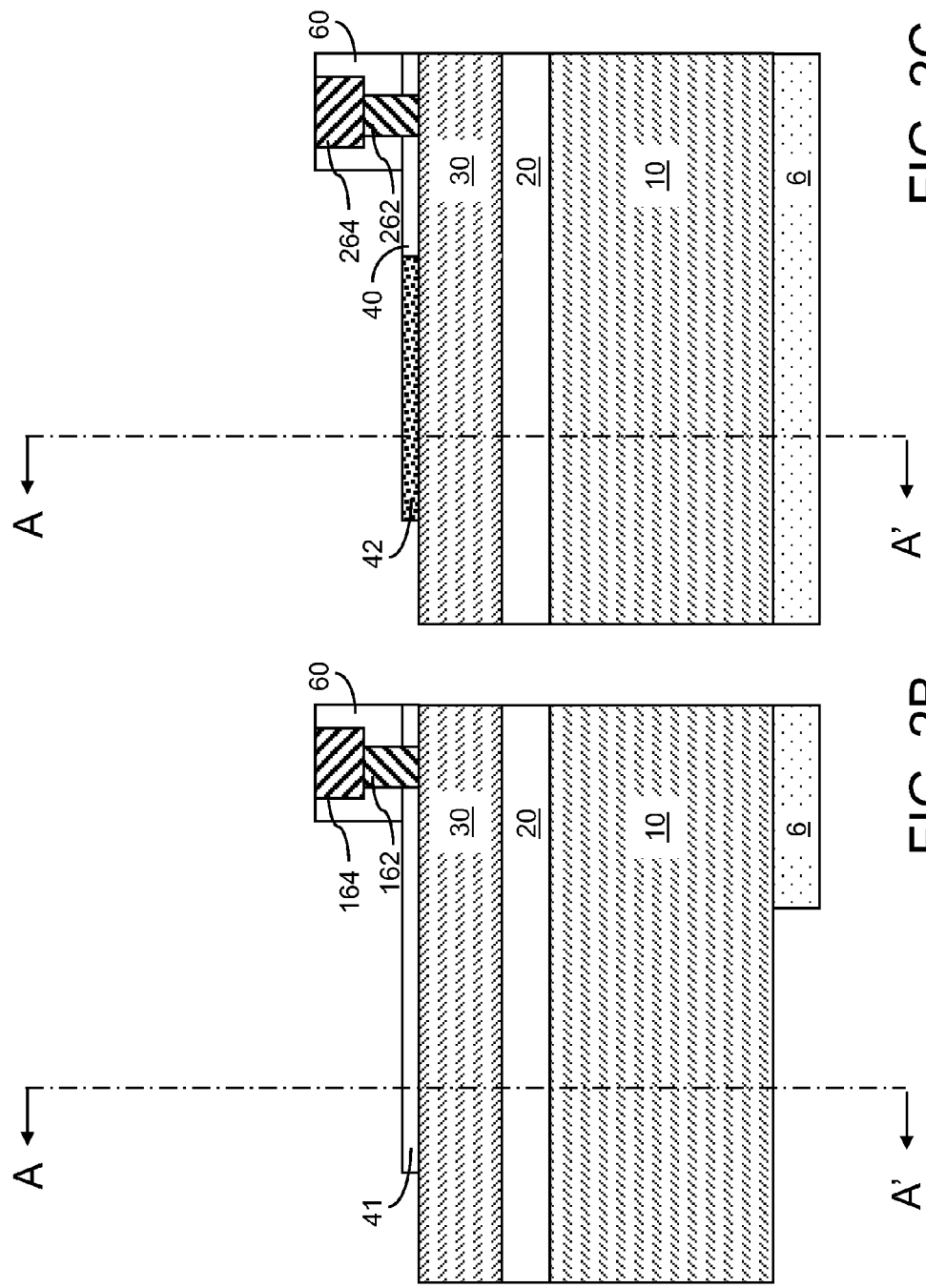

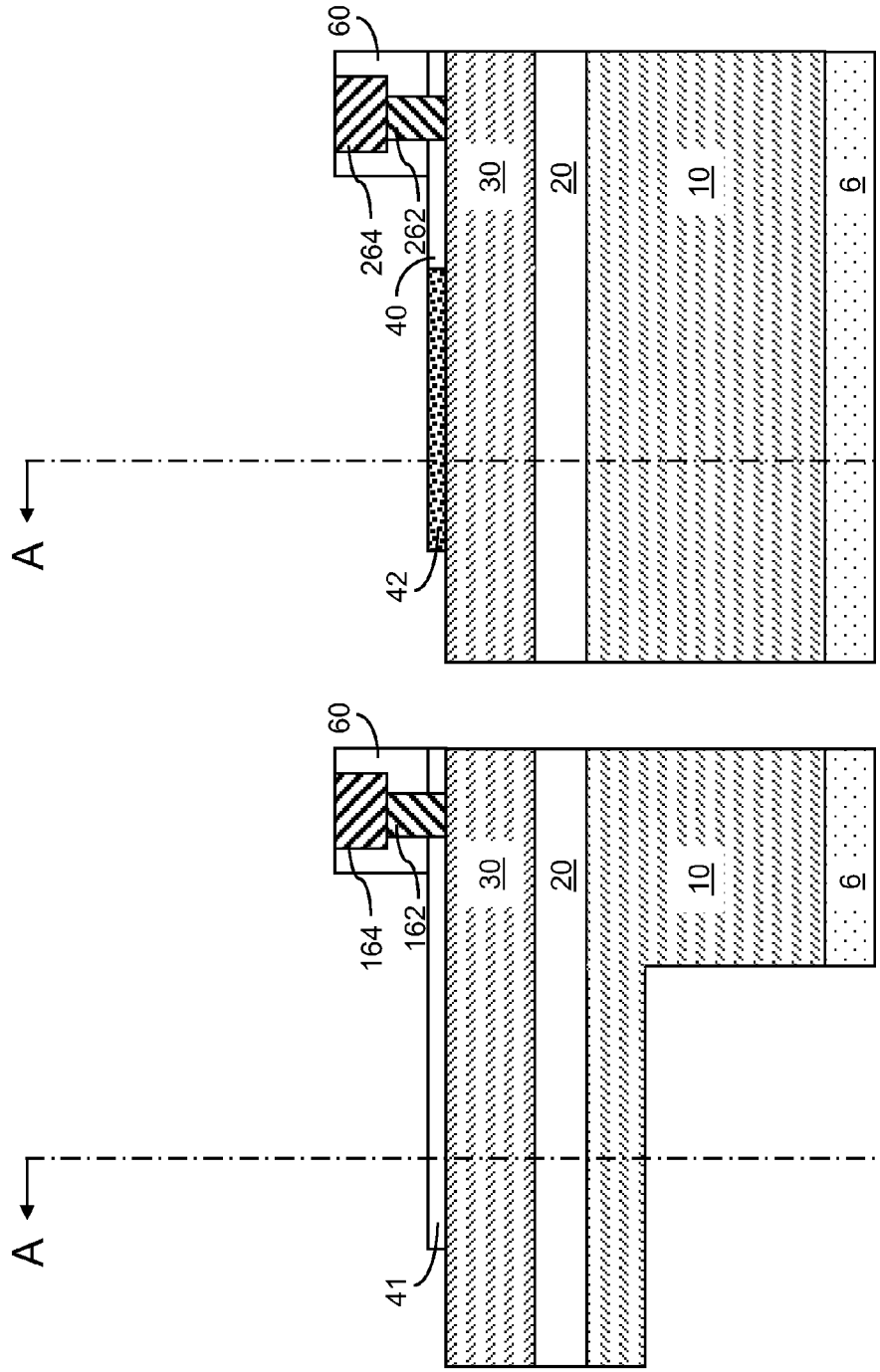

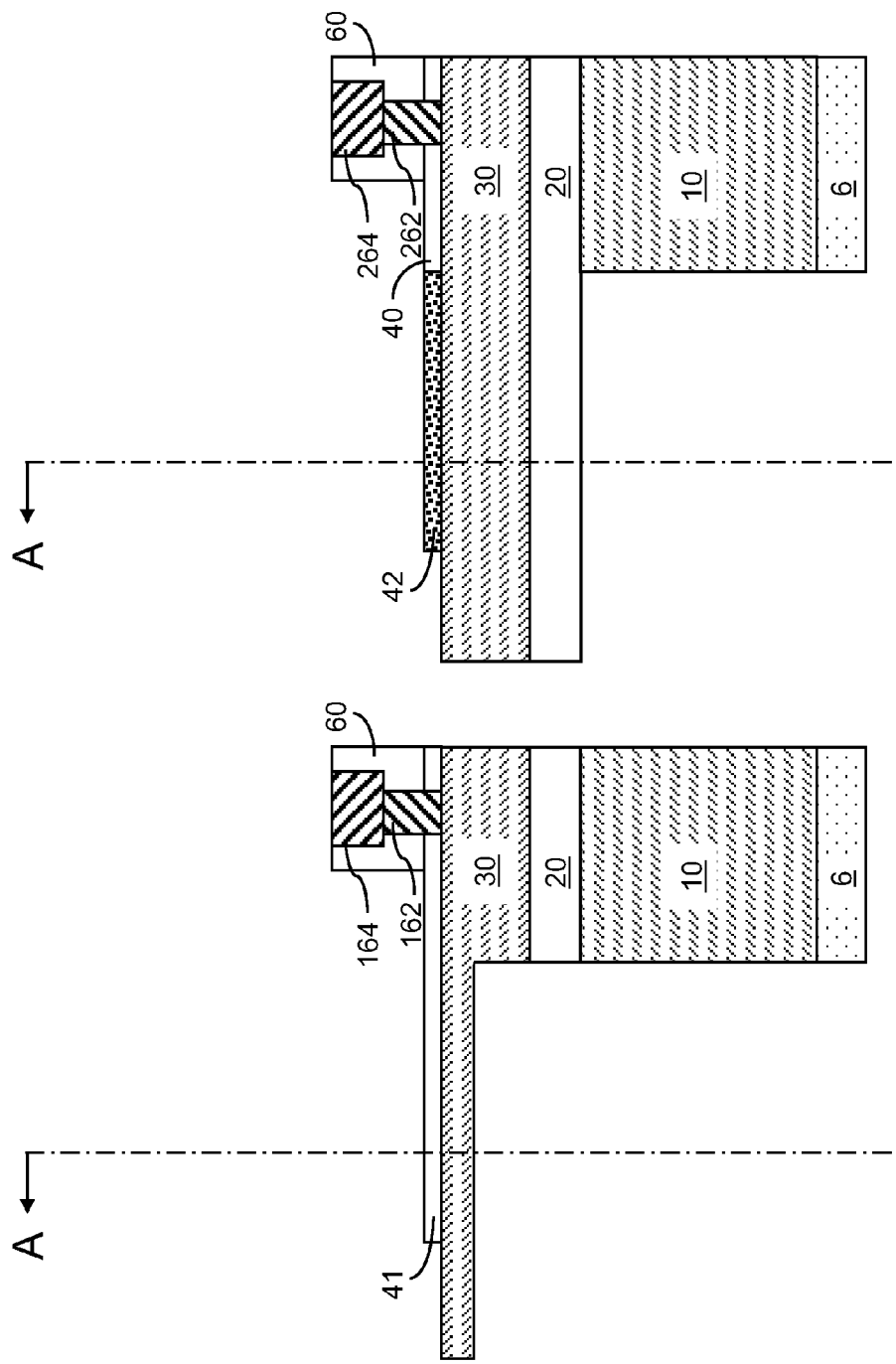

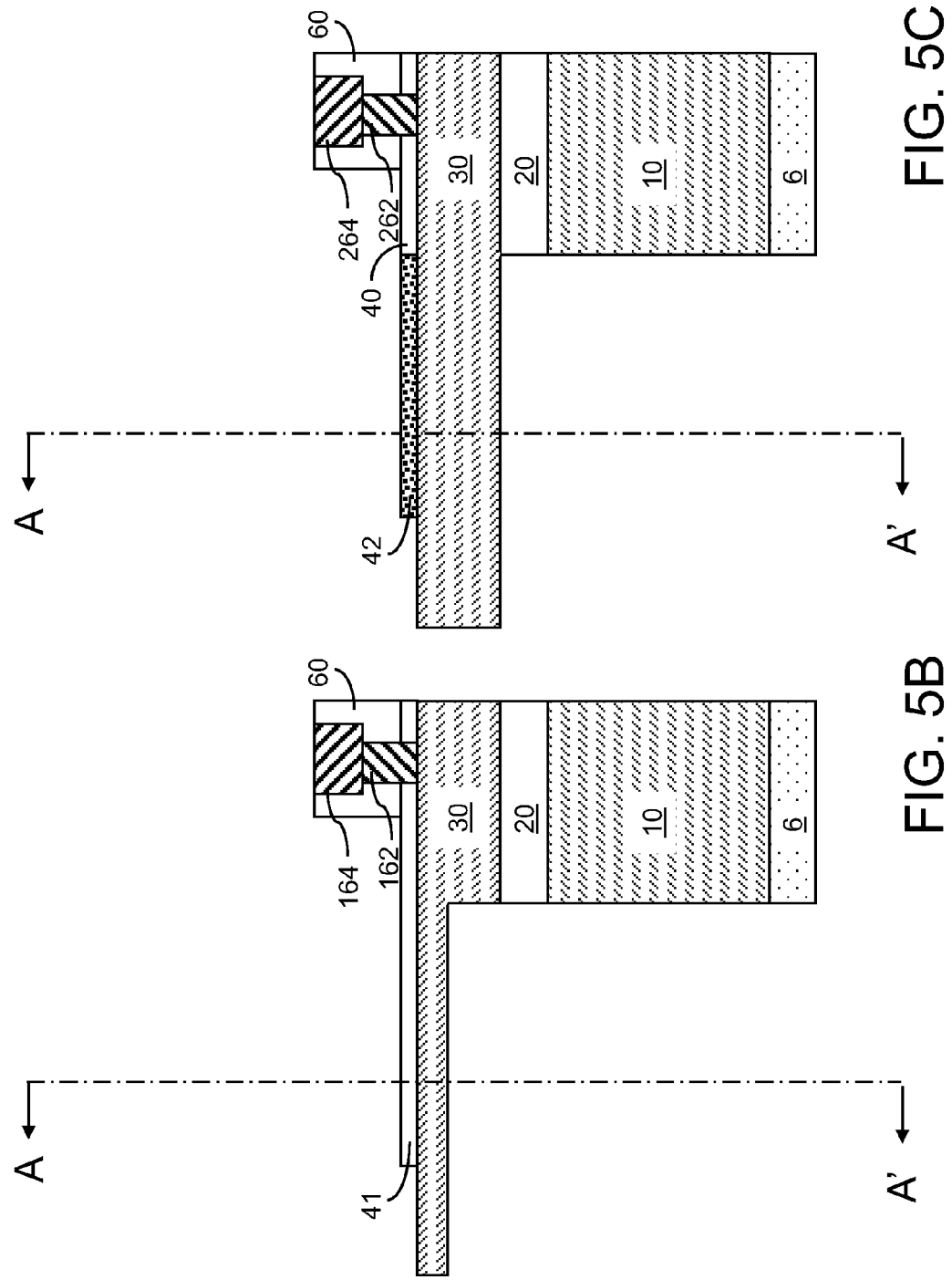

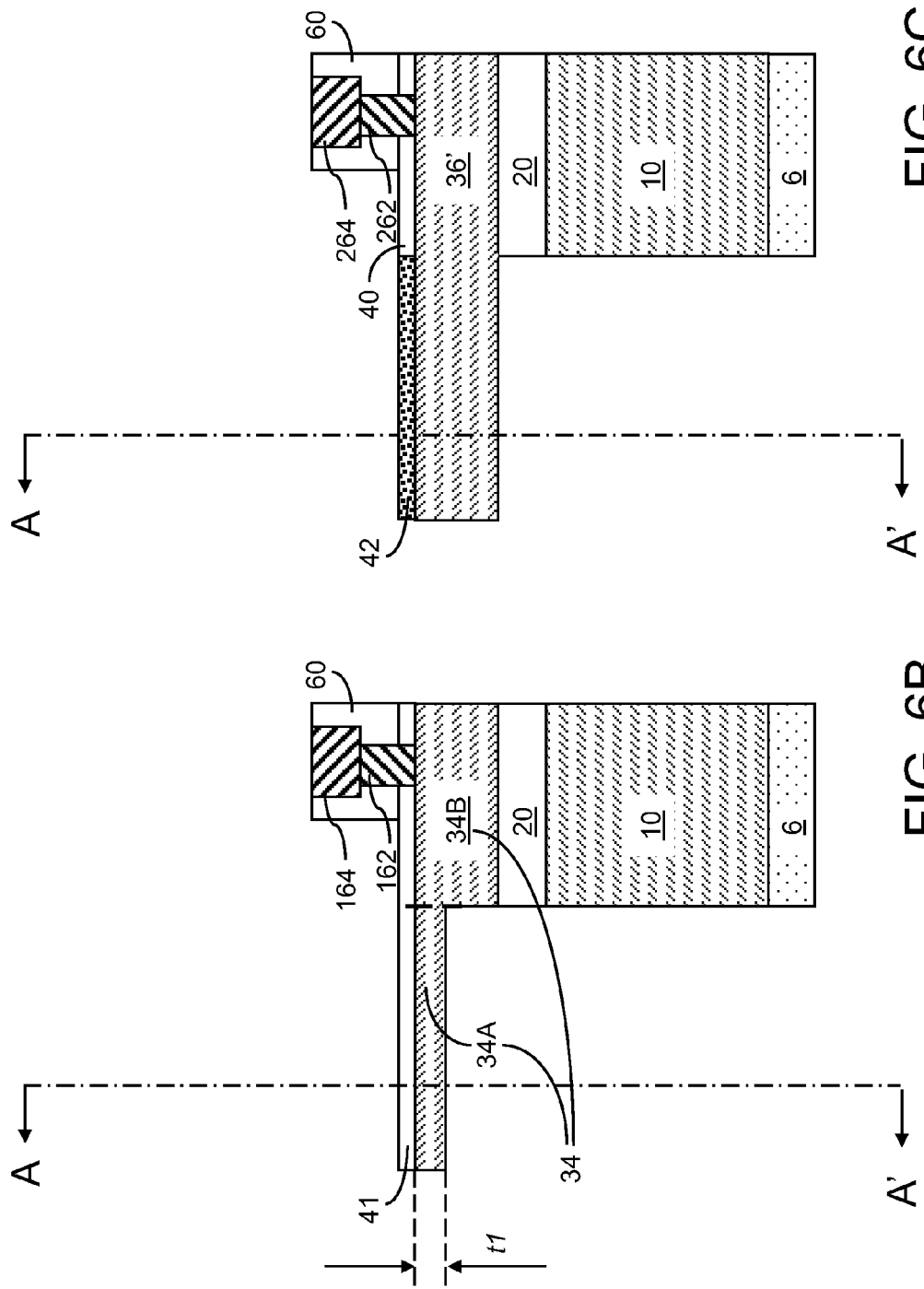

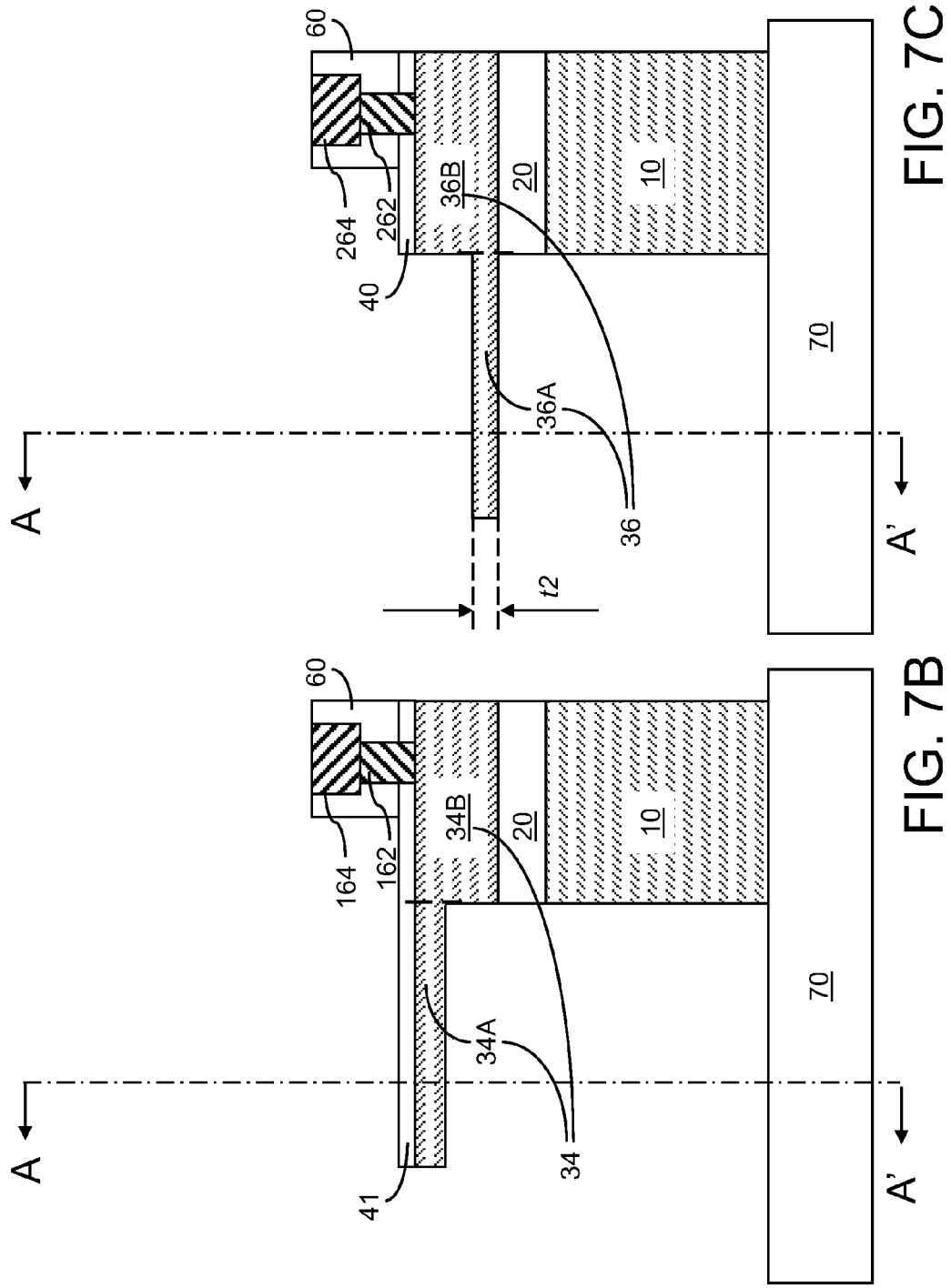

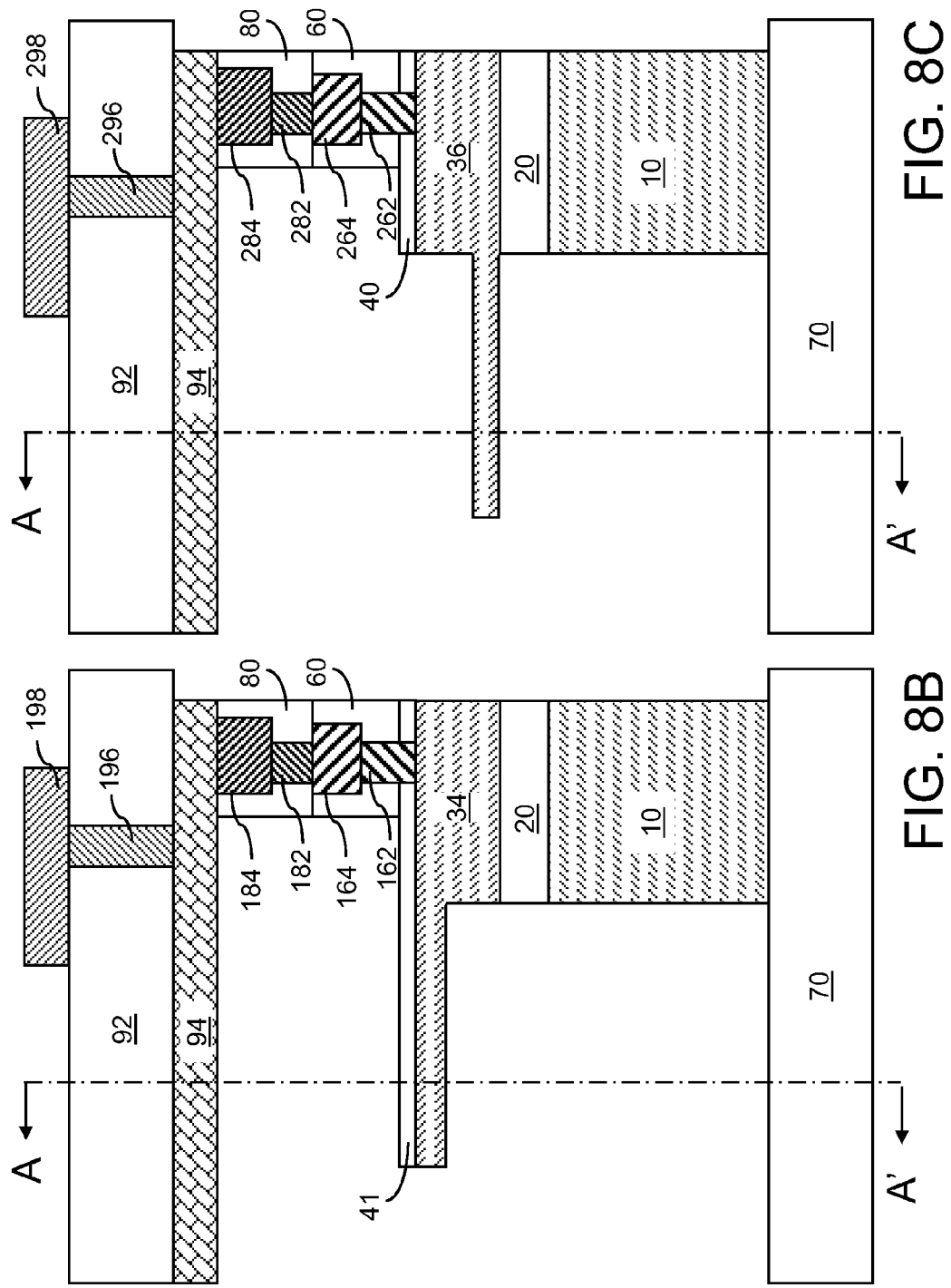

MICRO-ELECTRO-MECHANICAL SYSTEM TILTABLE LENS

BACKGROUND

The present invention relates to a tiltable micro-electro-mechanical system (MEMS) lens, an array of adjustable microlens structures, a design structure for the same, and a method of manufacturing the same.

Manipulation of an optical path of a lens is typically effected by a macroscopic movement of the lens. Such macroscopic movement requires a drive mechanism capable of generating sufficient power to enable the movement of the lens by overcoming mechanical frictions and/or gravitational forces.

Integration of a movable lens into hand-held or portable electronic devices faces difficulties because a typical drive mechanism, such as an electrical motor, occupies a large volume and consumes significant power. In addition, the size of traditional mechanisms greatly exceeds the special dimensions required for a suitable array of microscopic lenses. However, manipulation of optical paths is necessary to enable integration of a high fidelity optical system into a compact system, e.g., integration of a high resolution camera having a wide range of focal lengths or zoom positions into a cellular phone.

In view of the above, there exists a need for a micro-electro-mechanical system (MEMS) lens that is capable of altering optical path through an electrical control signal, a design structure for the same, and methods of manufacturing the same.

SUMMARY

The present invention provides a micro-electro-mechanical system (MEMS) lens that may be tilted by electrostatic force to a continuum of positions to alter a path of an optical beam, a design structure for the same, and methods of manufacturing the same.

In the present invention, a tiltable micro-electro-mechanical (MEMS) system lens comprises a microscopic lens located on a front surface of a semiconductor-on-insulator (SOI) substrate and a semiconductor rim surrounding the periphery of the microscopic lens. Two horizontal semiconductor beams located at different heights are provided within a top semiconductor layer. The microscopic lens may be tilted by applying an electrical bias between the lens rim and one of the two semiconductor beams, thereby altering the path of an optical beam through the microscopic lens. An array of tiltable microscopic lenses may be employed to form a composite lens having a variable focal length may be formed. A design structure for such a tiltable MEMS lens is also provided.

According to an aspect of the present invention, a structure is provided, which comprises:

a semiconductor-on-insulator (SOI) substrate including a patterned top semiconductor layer, a buried insulator layer, and a handle substrate;

a microlens located on the patterned top semiconductor layer and comprising an optically transparent material and having a convex or concave surface;

a lens rim abutting a peripheral portion of the microlens and comprising a doped semiconductor material;

a first horizontal semiconductor beam included in the patterned top semiconductor layer and located in proximity to the lens rim, but not abutting the lens rim; and a second horizontal semiconductor beam located in the patterned top semiconductor layer and located in proximity to the lens rim, but not abutting the lens rim, wherein the first and second horizontal semiconductor beams comprises a doped semiconductor material, and wherein the second horizontal semiconductor beam is vertically and laterally offset from the first horizontal semiconductor beam.

According to yet another aspect of the present invention, a design structure embodied in a machine readable medium for designing, manufacturing, or testing a design for a semiconductor structure is provided. The design structure comprises:

a first data representing a semiconductor-on-insulator (SOI) substrate including a patterned top semiconductor layer, a buried insulator layer, and a handle substrate;

a second data representing a microlens located on the patterned top semiconductor layer and comprising an optically transparent material and having a convex or concave surface;

a third data representing a lens rim abutting a peripheral portion of the microlens and comprising a doped semiconductor material;

a fourth data representing a first horizontal semiconductor beam included in the patterned top semiconductor layer and located in proximity to the lens rim, but not abutting the lens rim;

a fifth data representing a second horizontal semiconductor beam located in the patterned top semiconductor layer and located in proximity to the lens rim, but not abutting the lens rim, wherein the first and second horizontal semiconductor beams comprises a doped semiconductor material, and wherein the second horizontal semiconductor beam if vertically and laterally offset from the first horizontal semiconductor beam;

a sixth data representing a first doped top semiconductor portion located in the patterned top semiconductor layer, wherein the first doped semiconductor portion and the first horizontal semiconductor beam are of integral and unitary construction;

a seventh data representing a second doped top semiconductor portion located in the patterned top semiconductor layer, wherein the second doped semiconductor portion and the second horizontal semiconductor beam are of integral and unitary construction;

an eighth data representing a third doped top semiconductor portion located in the patterned top semiconductor layer, wherein the third doped top semiconductor portion and the lens rim are of integral and unitary construction;

a ninth data representing a first assembly of at least one first metal interconnect structure, wherein the first assembly vertically abuts the first doped top semiconductor portion;

a tenth data representing a second assembly of at least one second metal interconnect structure, wherein the second assembly vertically abuts the second doped top semiconductor portion;

an eleventh data representing a third assembly of at least one third metal interconnect structure, wherein the third assembly vertically abuts the third doped top semiconductor portion;

a twelfth data representing an upper transparent layer overlying the microlens, wherein the upper transparent layer and the lower transparent layer is attached to the SOI substrate;

a thirteenth data representing a lower transparent layer underlying the microlens, wherein the lower transparent layer is attached to the SOI substrate; and a fourteenth data representing a semiconductor device layer including at least one semiconductor device configured to apply electrical voltages to each of the lens rim and the first and second horizontal semiconductor beams.

According to still another aspect of the present invention, a design structure embodied in a machine readable medium for designing, manufacturing, or testing a design for a semiconductor structure is provided. The design structure represents an array of microlens structures having a variable focal point and includes a set of design elements, wherein light beam through each microlens in the array converges at the variable focal point. Each design element comprises:

a first data representing a portion of a semiconductor-on-insulator (SOI) substrate including a patterned top semiconductor layer, a buried insulator layer, and a handle substrate;

a second data representing a microlens located on the patterned top semiconductor layer and comprising an optically transparent material and having a convex or concave surface;

a third data representing a lens rim abutting a peripheral portion of the microlens and comprising a doped semiconductor material;

a fourth data representing a first horizontal semiconductor beam included in the patterned top semiconductor layer and located in proximity to the lens rim, but not abutting the lens rim; and a fifth data representing a second horizontal semiconductor beam located in the patterned top semiconductor layer and located in proximity to the lens rim, but not abutting the lens rim, wherein the first and second horizontal semiconductor beams comprises a doped semiconductor material, and wherein the second horizontal semiconductor beam if vertically and laterally offset from the first horizontal semiconductor beam.

According to another aspect of the present invention, a method of forming tiltable microlens structure is provided. The method comprises:

forming a microlens comprising an optically transparent material and having a convex or concave surface on a top semiconductor layer of a semiconductor-on-insulator (SOI) substrate, wherein the SOI substrate includes the top semiconductor layer, a buried insulator layer, and a handle substrate;

forming a lens rim directly on a peripheral portion of the microlens by patterning a portion of the top semiconductor layer;

forming a first horizontal semiconductor beam in proximity to the lens rim by patterning a portion of the top semiconductor layer; and forming a second horizontal semiconductor beam in proximity to the lens rim by patterning a portion of the top semiconductor layer, wherein the first and second horizontal semiconductor beams are formed vertically and laterally offset from each other.

In one embodiment, the method comprises:

forming at least one patterned hard mask layer comprising a dielectric material directly on a bottom surface of the handle substrate; and forming at least one trench extending upward from the bottom surface of the handle substrate within the handle substrate by transferring a pattern in the hard mask layer into the handle substrate by an anisotropic etch.

BRIEF DESCRIPTION OF THE DRAWINGS

For all of the figures herein, the following conventions apply. Figures with the same numeric label correspond to the same stage of manufacturing in the same embodiment. Figures with the suffix "A" are vertical cross-sectional views along the plane A-A' of the figures with the same numeric label and the suffixes "B" or "C." Figures with the suffix "B" or "C" are horizontal cross-sectional views along the plane B-B' or C-C', respectively, of the figure with the same numeric label and the suffix "A." Figures without an alphabetical suffix are vertical cross-sectional views.

FIGS. 1A-8C are sequential vertical cross-sectional views of a first exemplary semiconductor structure according to a first embodiment of the present invention.

DETAILED DESCRIPTION

Figure 1A:
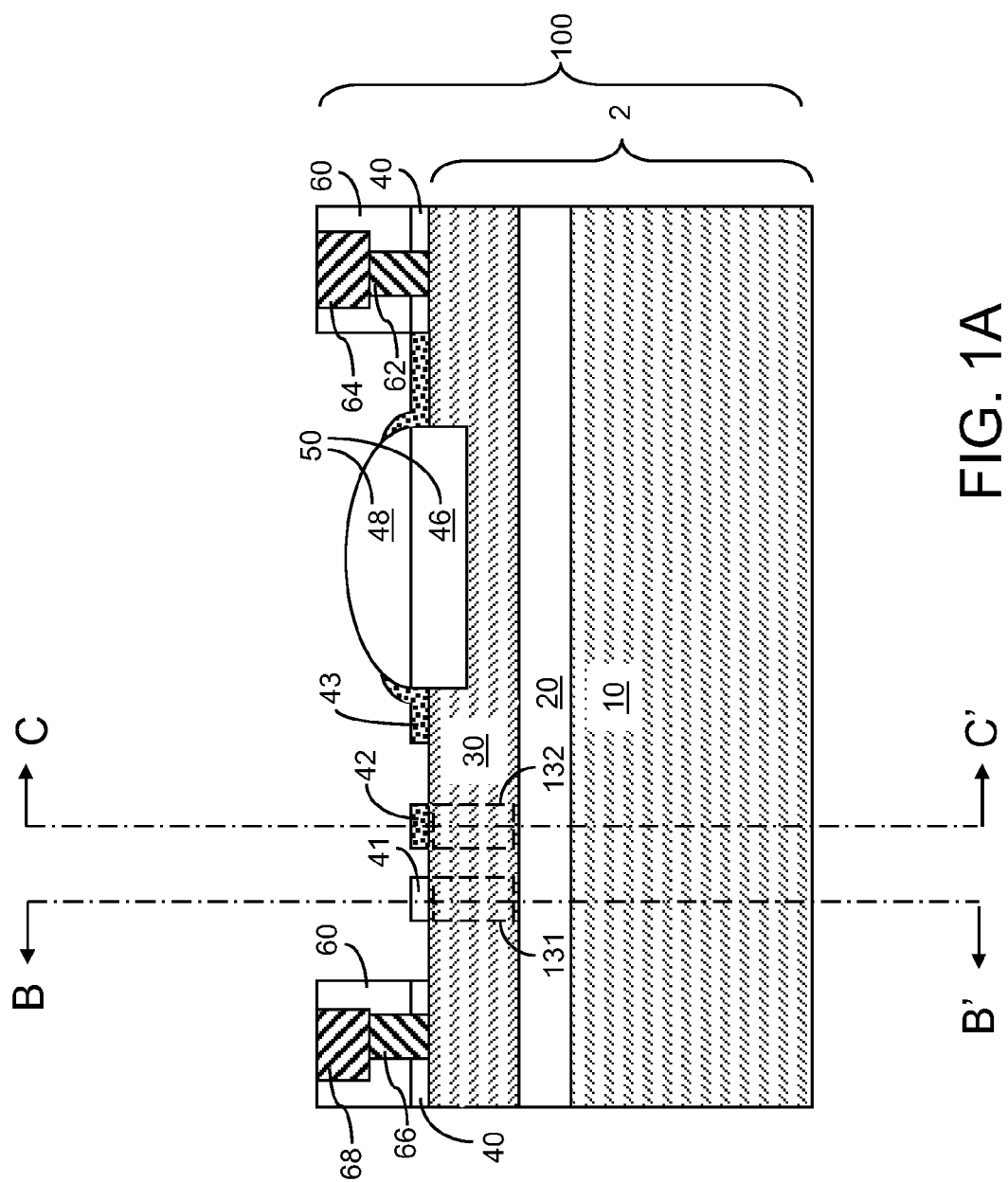

As stated above, the present invention relates to a tiltable micro-electro-mechanical system (MEMS) lens, an array of microlens structures, a design structure for the same, a method of manufacturing the same, and a method of operating the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a "microlens" is a lens having microscopic dimensions. Specifically, the microlens has a lateral dimension that is less than a typical lateral dimension of a semiconductor chip, which is about 30 mm or less. The microlens has a thickness, as measured between the thickest portion of the microlens, which is less than the thickness of a total dielectric material stack on a semiconductor substrate. Thus, the "microlens" may have lateral dimensions from about 0.2 µm to about 30 mm, and typically from about 2 µm to about 1 mm, although lesser and greater lateral dimensions within the capability of semiconductor processing technology are also contemplated herein. The microlens may have a thickness from about 10 nm to about 50 mm, and typically from about 200 nm to about 4 µm, although lesser and greater thicknesses are also contemplated herein.

Referring to FIGS. 1A-1C, a first exemplary semiconductor structure is show, which is a microlens structure including a microlens 50. The first exemplary semiconductor structure includes a semiconductor-on-insulator (SOI) substrate 2, which includes a top semiconductor layer 30, a buried insulator layer 20, and a handle substrate 10. Typically, the thickness of the SOI substrate 2 is from about 400 µm to about 1,000 µm.

The handle substrate 10 may comprise a semiconductor material, an insulator material, or a metallic material. For example, the handle substrate 6 may comprise single crystalline semiconductor material such as silicon. The buried insulator layer 20 comprises a dielectric material such as silicon oxide or silicon nitride. The top semiconductor layer 30 comprises a semiconductor material. Preferably, the semiconductor material comprises a single crystalline semiconductor material having an epitaxial alignment among atoms within the entirety of the top semiconductor layer. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon. The thickness of the top semiconductor layer may be from about 10 nm to about 50 μm, and typically from about 100 nm to about 1 μm, although lesser and greater thicknesses are also contemplated herein.

The semiconductor material within the top semiconductor layer 30 may be doped with electrical dopants. The entirety of the top semiconductor layer 30 may be doped with the electrical dopants, or only portions to constitute electrically conductive portions may be doped with the electrical dopants. In case the doping is p-type, the electrical dopants may be at least one of p-type dopants such as B, Ga, and In. In case the doping is n-type, the electrical dopants may be at least one of n-type dopants such as P, As, and Sb. Typically, the concentration of the electrical dopants to form conductive portions may be from about $1.0 \times 10^{14}$ atoms/cm$^3$ to about $3.0 \times 10^{21}$ atoms/cm$^3$, and preferably from about $1.0 \times 10^{19}$ atoms/cm$^3$ to about $1.0 \times 10^{21}$ atoms/cm$^3$, although lesser and greater concentrations are also contemplated herein.

The present invention may be implemented in an SOI portion of a hybrid substrate that contains a bulk portion and the SOI portion. Such variations are explicitly contemplated herein.

The microlens 50 is formed on a top surface of the top semiconductor layer 30 by deposition and patterning of an optically transparent material. Optically transparent materials that may be employed for the microlens include materials that are transparent throughout an entirety of the visible spectrum, materials that are transparent within a wavelength range of the visible spectrum, materials that are transparent to ultraviolet radiation, or materials that are transparent to infrared radiation. Exemplary optically transparent materials include silicate glass, aluminum oxide, diamond, transition metal oxides having a wide band gap, i.e., having a band gap corresponding to a wavelength within the visible spectrum or ultraviolet radiation, etc.

The microlens 50 comprises a lower microlens portion 46 and an upper microlens portion 48, which may comprise the same material or different materials. At least a lower part of the lower microlens portion 46 is embedded in the top semiconductor layer 30. A bottom surface of the lower microlens portion 46 is located below the level of the top surface of the top semiconductor layer 30. The bottom surface of the lower microlens portion 46 may be located at any level between the top surface of the top semiconductor layer 30 and a bottom surface of the top semiconductor layer 30. In some cases, the bottom surface of the lower microlens portion 46 may extend to the top surface of the buried insulator layer 20 and abut a top surface of the buried insulator layer 20. The bottom surface of the lower microlens portion 46 may be substantially planar, or may be convex or concave. In some embodiments, the lower microlens portion 46 may be formed concurrently with shallow trench isolation structures (not shown), and may comprise a dielectric oxide, a dielectric nitride, a dielectric oxynitride, or a combination thereof.

The upper microlens portion 48 protrudes above the top surface of the top semiconductor layer 10. The upper microlens portion 48 vertically abuts the lower microlens portion 46. The interface between the upper microlens portion 48 and the lower microlens portion 46 may be planar or curved. The top surface of the upper microlens portion 48 may be convex, concave, or planar. At least one of the top surface of the upper microlens portion 48, the interface between the upper microlens portion 48 and the lower microlens portion 46, and the bottom surface of the lower microlens portion 46 is convex or concave.

A first dielectric material portion 41 comprising a first dielectric material is formed on a first semiconductor portion 131 of the top semiconductor layer 30. The first semiconductor portion 131 is the region of the top semiconductor layer that directly underlies the first dielectric material portion 41. The first dielectric material is a material that may be employed as an etch mask for removal of the material of the top semiconductor layer 30 in subsequent processing steps. For example, the first dielectric material portion 41 may comprise silicon oxide.

A second dielectric material portion 42 and a third dielectric material portion 43 are formed on the top surface of the top semiconductor layer. The second dielectric material portion 42 is formed on a second semiconductor portion 132 of the top semiconductor layer 30. The second semiconductor portion 132 is the region of the top semiconductor layer 30 that directly underlies the second dielectric material portion 42. The second dielectric material is different from the first dielectric material, and is a material that may be employed as an etch mask for removal of the material of the top semiconductor layer 30 in subsequent processing steps. For example, the second dielectric material portion 42 may comprise silicon nitride.

The third dielectric material portion 43 comprises the second dielectric material. The second dielectric material portion 42 and the third dielectric material portion 43 may be formed at the same time by deposition and patterning of a dielectric material layer. The third dielectric material portion 43 is formed around a peripheral portion of the microlens 50, and laterally surrounds the microlens 50. Thus, the third dielectric material portion 43 includes a hole within, and is topologically homeomorphic to a torus, i.e., may be continually bended and stretched to a torus without forming or destroying a topological singularity.

In addition, a pad dielectric material layer 40 may be formed on the top surface of the top semiconductor layer 30. The pad dielectric material layer 40 may comprise the same material as, or a different material from, the first dielectric material portion 41 or the second dielectric material portion 42.

Assemblies of metal interconnect structures may be formed on the top semiconductor layer 30. For example, a first lower metal interconnect structure may include at least one first lower via structure 162 and at least one first lower metal line 164. A second lower metal interconnect structure may include at least one second lower via structure 262 and at least one second lower metal line 264. A third lower metal interconnect structure may include at least one third lower via structure 62 and at least one third lower metal line 64. A fourth lower metal interconnect structure may include at least one fourth lower via structure 66 and at least one fourth lower metal line 68. Each of the first through fourth lower metal interconnect structures may be embedded in a back-end-of-line (BEOL) dielectric material layer 60, which comprises a dielectric material employed in back-end-of-line semiconductor processing steps.

The BEOL dielectric material layer 60 may comprise an oxide based conventional dielectric material, which has a dielectric constant k from about 3.6 to about 3.9, or a low-k dielectric material, which has a dielectric constant k of about 3.0 or less, preferably less than about 2.8, and more preferably less than about 2.5. Non-limiting examples of the oxide based conventional dielectric material included undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether, which is also commonly referred to as "Silicon Low-K", or "SiLK™." The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, O and H in a covalently bonded tri-dimensional network.

The first exemplary semiconductor structure including the SOI substrate 2, the microlens 50, the first, second, and third dielectric material portions (41, 42, 43), the pad dielectric material layer 40, the first through fourth lower metal interconnect structures, and the BEOL dielectric material layer 60 are collectively referred to as a microlens-containing assembly 100.

Figure 2A:
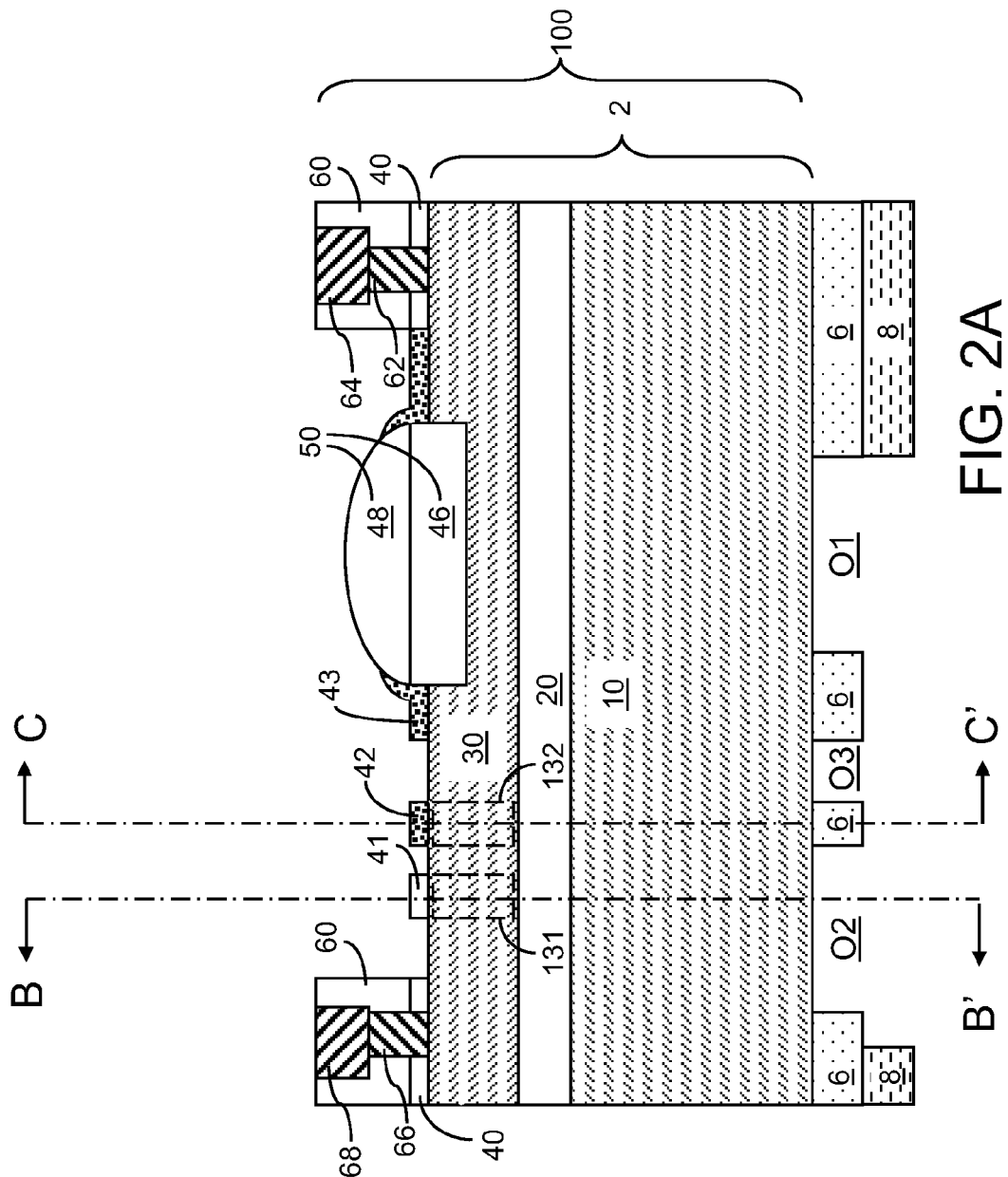

Referring to FIGS. 2A-2C, a first patterned hard mask layer 6 is formed on the back side of the SOI substrate 2, i.e., on the bottom surface of the handle substrate 10. The first patterned hard mask layer 6 may be formed, for example, by deposition of a blanket hard mask layer and lithographic patterning thereof. The first patterned hard mask layer 6 may comprise a dielectric material such as silicon oxide or silicon nitride. The thickness of the first patterned hard mask layer 6 may be from about 100 nm to about 10 µm, and typically from about 300 nm to about 1,200 nm, although lesser and greater thicknesses are also contemplated herein.

The openings in the first patterned hard mask layer 6 include a first opening O1, a second opening O2, and a third opening O3. The first opening O1 underlies the microlens 50. The second opening O2 underlies the first semiconductor portion 131 of the top semiconductor layer 10 and does not underlie, and is laterally offset from, the microlens 50. The third opening O3 underlies a region of the top semiconductor layer 30 that is located between the second semiconductor portion 132 and the microlens 50. The third opening does not underlie, and is laterally offset from, the microlens 50, the first semiconductor portion 131, and the second semiconductor portion 132 of the top semiconductor layer 30.

A second patterned hard mask layer 8 is on the first patterned hard mask layer 6, i.e., on the bottom surface of the first patterned hard mask layer 6. The second patterned hard mask layer 8 may be formed, for example, by deposition of another blanket hard mask layer and lithographic patterning thereof. The second patterned hard mask layer 8 may comprise a dielectric material such as silicon oxide or silicon nitride. Preferably, the second patterned hard mask layer 8 comprises a different material than the first patterned hard mask layer 6. For example, the first patterned hard mask layer 6 may comprise silicon oxide and the second patterned hard mask layer 8 may comprise silicon nitride. The thickness of the second patterned hard mask layer 8 may be from about 50 nm to about 3 µm, and typically from about 150 nm to about 600 nm, although lesser and greater thicknesses are also contemplated herein. The area of an opening in the second patterned hard mask layer 8 includes the areas of the first opening O1, the second opening O2, and the third opening O3. The opening in the second patterned hard mask layer 8 underlies the second semiconductor portion 132 of the top semiconductor layer 30.

Figure 3A:
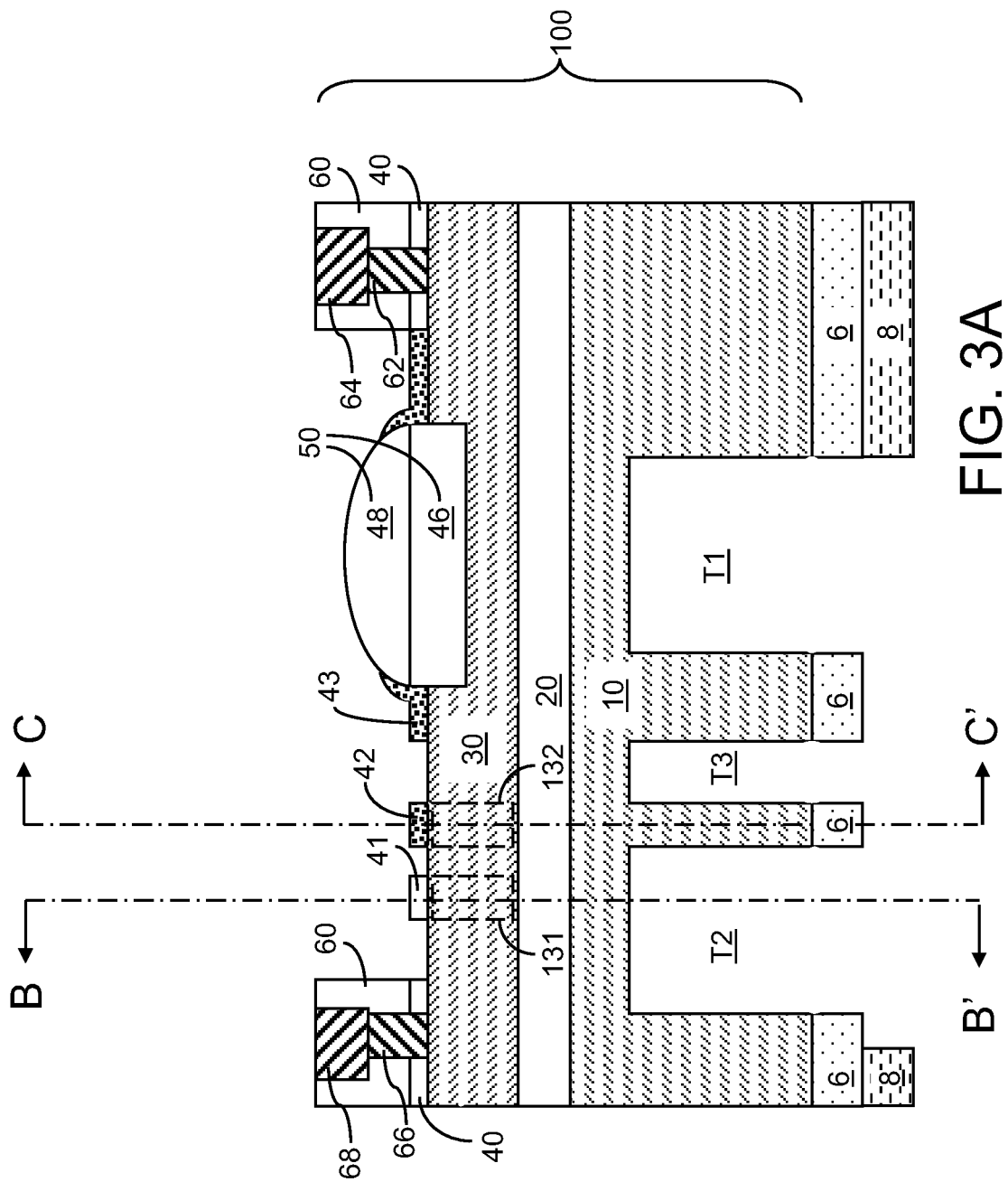
Figure 4A:
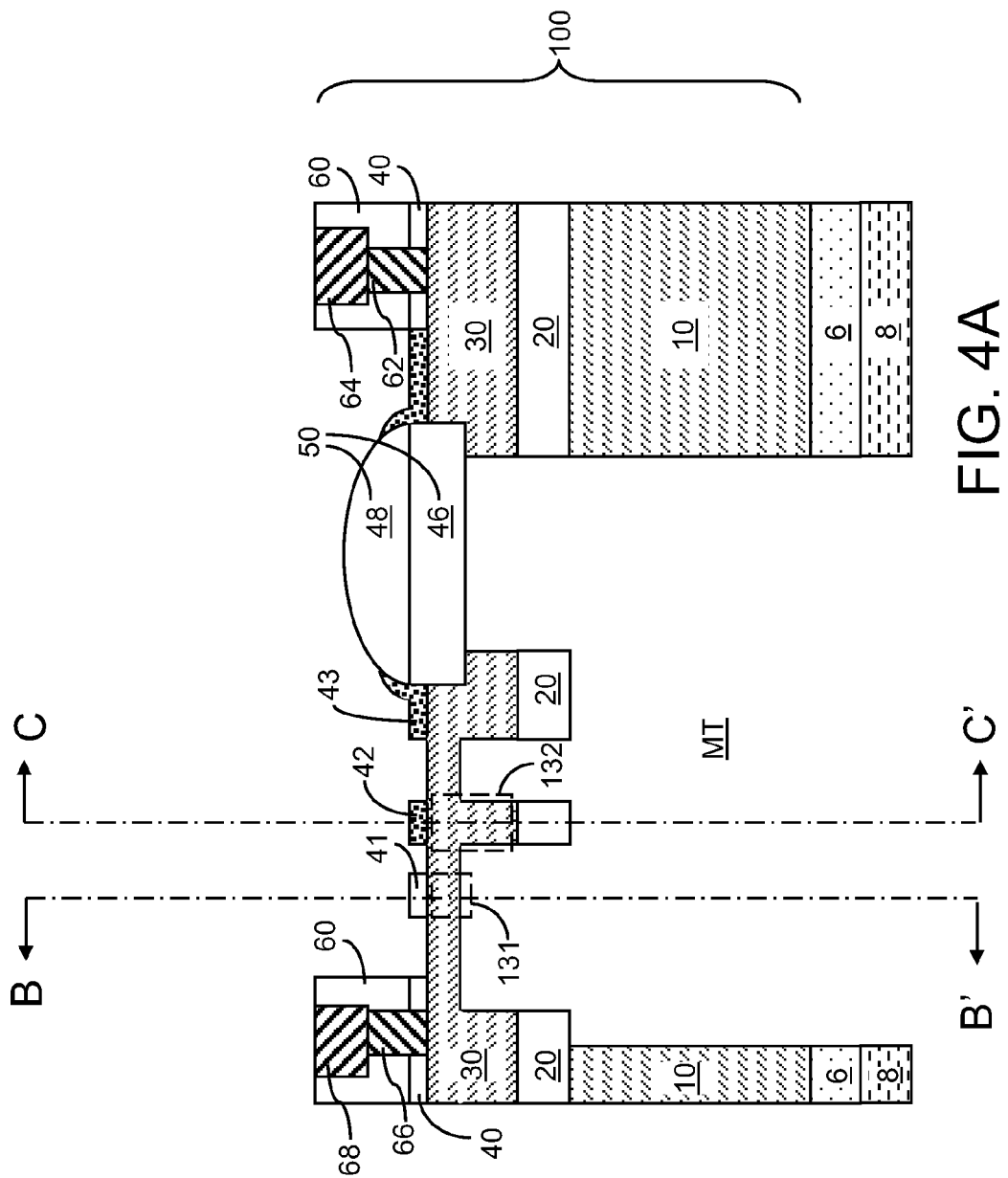

Referring to FIGS. 3A-3C, the handle substrate 10 is etched employing the combination of the first and second patterned hard mask layers (6, 8) as an etch mask. For example, if the handle substrate 10 comprises single crystalline silicon and the first patterned hard mask layer 6 comprises silicon oxide and the second patterned hard mask layer 8 comprises silicon nitride, an anisotropic etch that removes silicon selective to silicon oxide and silicon nitride may be employed. Alternately, an isotropic etch may be employed to etch the material of the handle substrate 10 depending on the ratio of lateral dimensions and vertical dimensions of the trenches that are formed in the handle substrate 10.

The trenches include a first trench T1 that underlies the microlens 50, a second trench T2 that underlies the first semiconductor portion 131, and a third trench T3 that underlies a portion of the top semiconductor layer 30 between the second semiconductor portion 132 and the microlens 50. A portion of the first hard mask layer 6 underlies the second semiconductor portion 132. In same embodiments, the positions of the first and second semiconductor portions (131, 132) may be exchanged or otherwise rearranged.

The pattern of the first hard mask layer 6 is transferred into the buried insulator layer 20 by at least one etch, which may be an anisotropic etch such as a reactive ion etch, an isotropic etch such as a wet etch, or a combination of an anisotropic etch and an isotropic etch. The second patterned hard mask layer 8 is employed as an etch mask layer to remove exposed portions of the first patterned hard mask layer 6. The second patterned hard mask layer 8 is employed as an etch mask to remove additional material of the handle substrate 10. An anisotropic etch, an isotropic etch, or a combination thereof may be employed to expand the first, second, and third trenches (T1, T2, T3), thereby forming a merged trench MT. The merged trench MT is a single contiguous trench that extends from the bottom surface of the handle substrate 10 to a set of surfaces located between a bottommost surface of the top semiconductor layer 30 and a topmost surface of the top semiconductor layer 30. The bottommost surface of the top semiconductor layer 30 abuts a top surface of the buried insulator layer 20, and the topmost surface of the top semiconductor layer abuts the first and second dielectric material portions (41, 42).

A bottom sub-portion of the first semiconductor portion is removed during the formation of the merged trench MT. The remaining sub-portion of the first semiconductor portion 131 overlies a surface among the set of surfaces located between the bottommost surface of the top semiconductor layer 30 and the topmost surface of the top semiconductor layer 30. An upper sub-portion of the portion of the top semiconductor layer 30 between the second semiconductor portion 131 and the microlens 50 overlies another surface among the set of surfaces located between the bottommost surface of the top semiconductor layer 30 and the topmost surface of the top semiconductor layer 30.

The bottom surface of the microlens 50 is exposed. The depth of vertical etch of the top semiconductor layer from below, which may be effected, for example, by placing the first exemplary semiconductor structure upside down and performing an etch in a process chamber, is controlled such that the etch does not remove the semiconductor material of the top semiconductor layer 30 through. Thus, the entirety of the top semiconductor layer 30 is of integral and unitary construction at this step. The central portion of the top surface and the central portion of the bottom surface of the microlens 50 are exposed at this step. Thus, the top semiconductor layer 30 laterally surrounds and laterally encloses the microlens 50. Further, the top semiconductor layer 30 provides mechanical support to, i.e., holds, the microlens 50.

Figure 5A:
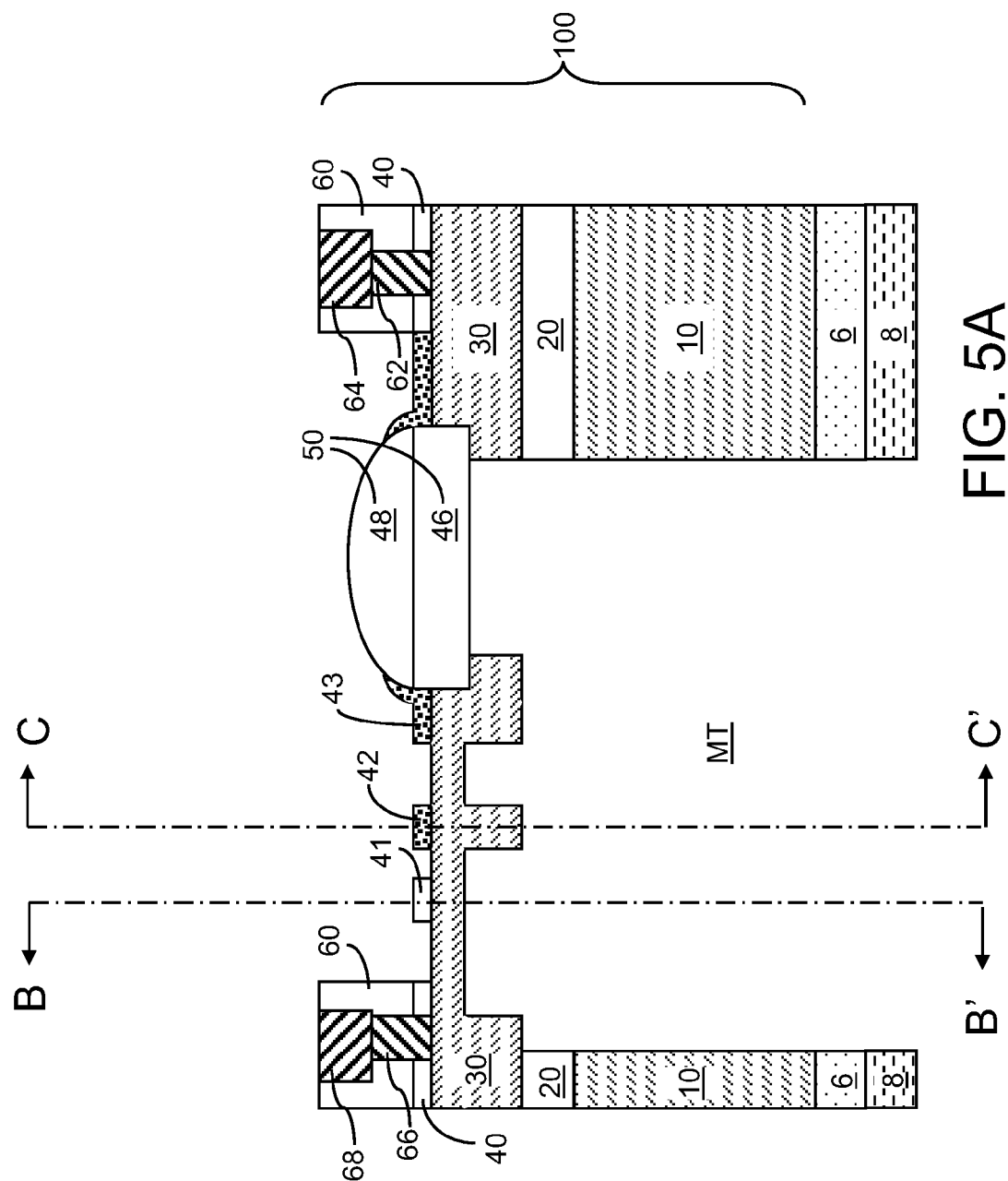

Referring to FIGS. 5A-5C, the exposed portions of the buried insulator layer 20 are removed by an etch, which may be an anisotropic etch. Depending on the thickness of the buried insulator layer 20 and the allowable lateral undercut of the buried insulator layer 20, an isotropic etch such as a wet etch may be employed. The material of the buried insulator layer 20 and the material of the lower microlens portion 46 may be different. In this case, an etch that removes the material of the buried insulator layer 20 selective to the lower microlens portion 46 may be employed.

Figure 6A:
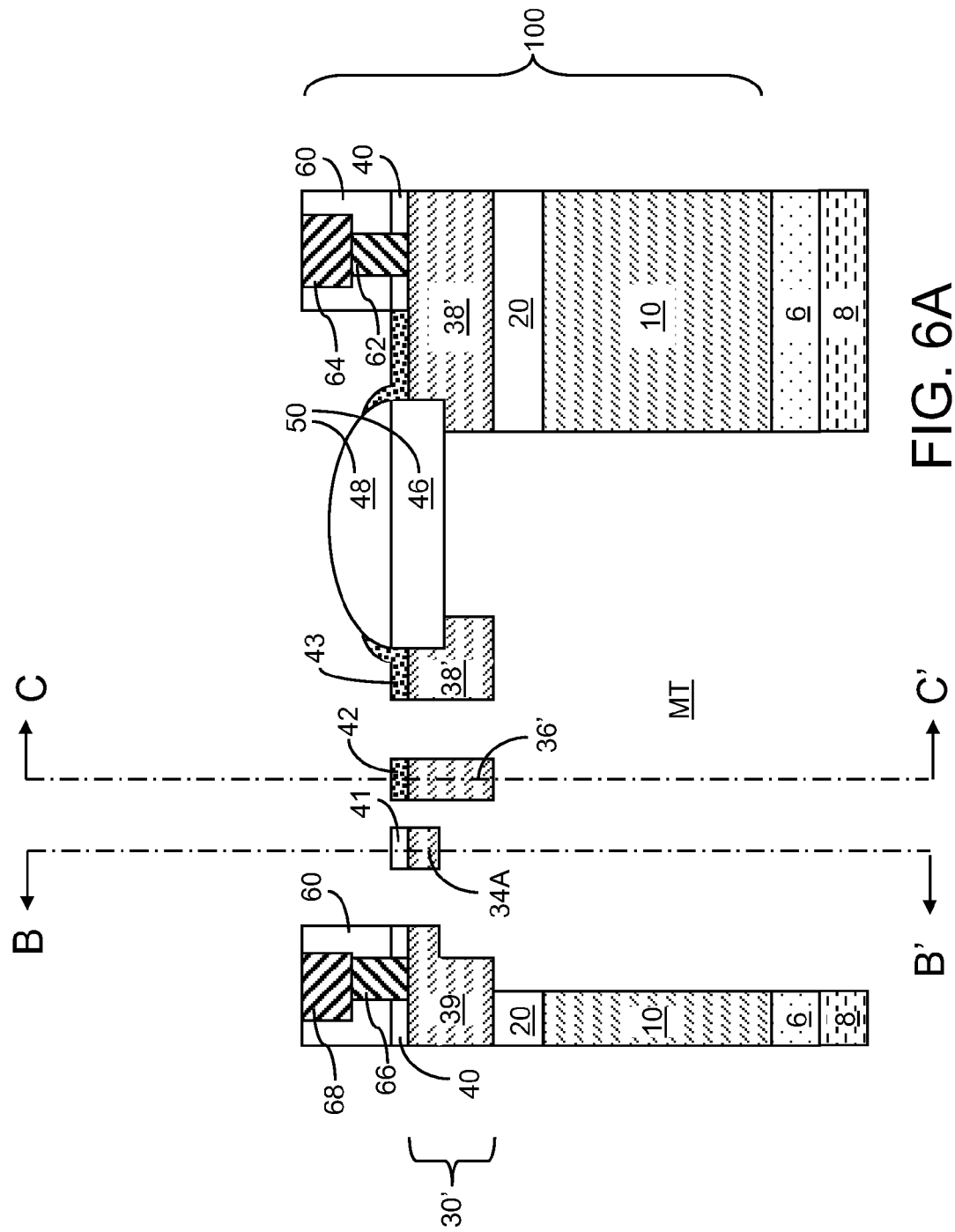

Referring to FIGS. 6A-6C, the first exemplary semiconductor structure is placed in a processing chamber in an upright position. An anisotropic etch is employed that removes the semiconductor material selective to the materials of the first, second, and third dielectric material portions and the material of the upper microlens portion 48. Preferably, the anisotropic etch is also selective to the materials of the first through fourth lower metal interconnect structures and the BEOL dielectric material layer 60.

Portions of the top semiconductor layer 30 are recessed from above at least until openings into the merged trench MT are formed in the top semiconductor layer 30. In other words, the exposed portions of the top semiconductor layer 30 are etched through to the merged trench MT. Disjoined semiconductor portions are formed from the remainder of the top semiconductor layer 30. The remaining disjoined portions of the top semiconductor layer 30 are herein collectively referred to as a patterned top semiconductor layer 30'. Specifically, a first horizontal semiconductor beam 34A having a first constant vertical thickness t1 and a first doped top semiconductor portion 34B are formed underneath the first dielectric material portion 41. The first constant vertical thickness t1 is less than the original thickness of the top semiconductor layer 30, and may be from about 5 nm to about 25 μm, and typically from about 50 nm to about 0.5 μm, although lesser and greater thicknesses are also contemplated herein. The first horizontal semiconductor beam 34A and the first doped top semiconductor portion 34B are of integral and unitary construction, and collectively constitute a first horizontal-beam-containing semiconductor structure 34. The first lower metal interconnect structure (162, 164) is resistively connected to the first horizontal-beam-containing semiconductor structure 34, which comprises a doped semiconductor material. The first horizontal-beam-containing semiconductor structure 34 is structurally supported by a portion of the buried insulator layer 20 located underneath.

A first prototype semiconductor structure 36' is formed underneath the second dielectric material portion. The first prototype semiconductor structure 36' is electrically isolated from the first horizontal-beam-containing semiconductor structure 34. The first prototype semiconductor structure 36' does not abut the first horizontal-beam-containing semiconductor structure 34. The shallow trench isolation structure may be located between the level of the topmost surface of the patterned top semiconductor layer 30' and the bottommost surface of the patterned top semiconductor layer 30'. The vertical thickness of the first prototype semiconductor structure 36' is substantially the same as the original thickness of the top semiconductor layer 30 (See FIG. 1A). The second lower metal interconnect structure (262, 264) is resistively connected to the first prototype semiconductor structure 36', which comprises a doped semiconductor material. The first prototype semiconductor structure 36' is structurally supported by a portion of the buried insulator layer 20 located underneath.

A second prototype semiconductor structure 38' having substantially the same thickness as the original thickness of the top semiconductor layer 30 is formed around the periphery of the microlens 50. Specifically, the second prototype semiconductor structure 38' laterally abuts and laterally surrounds the sidewalls of the microlens 50. The second prototype semiconductor structure 38' is electrically isolated from the first horizontal-beam-containing semiconductor structure 34 and the first prototype semiconductor structure 36'. The second prototype semiconductor structure 38' does not abut the first horizontal-beam-containing semiconductor structure 34 or the first prototype semiconductor structure 36'. The third lower metal interconnect structure (62, 64) is resistively connected to the second prototype semiconductor structure 38', which comprises a doped semiconductor material. The second prototype semiconductor structure 38' is structurally supported by a portion of the buried insulator layer 20 located underneath.

The patterned top semiconductor layer 30' may include a miscellaneous top semiconductor portion 39, which may be doped or undoped, and may be employed to form other semiconductor devices. The fourth lower metal interconnect structure (66, 68) may be located directly on the miscellaneous top semiconductor portion 39 to enable electrical connection in the semiconductor devices that may be present in the miscellaneous top semiconductor portion 39. Optionally, shallow trench isolation structures (not shown) may be provided between the first prototype semiconductor structure 36', the first horizontal-beam-containing semiconductor structure 34, the second prototype semiconductor structure 38', and the miscellaneous top semiconductor portion 39 for electrical isolation and/or lateral structural support. In this case, the shallow trench isolation structures are formed prior to separation of the top semiconductor layer 30 into the various top semiconductor structures (34, 36', 38', 39) in the patterned top semiconductor layer 30'.

Figure 7A:
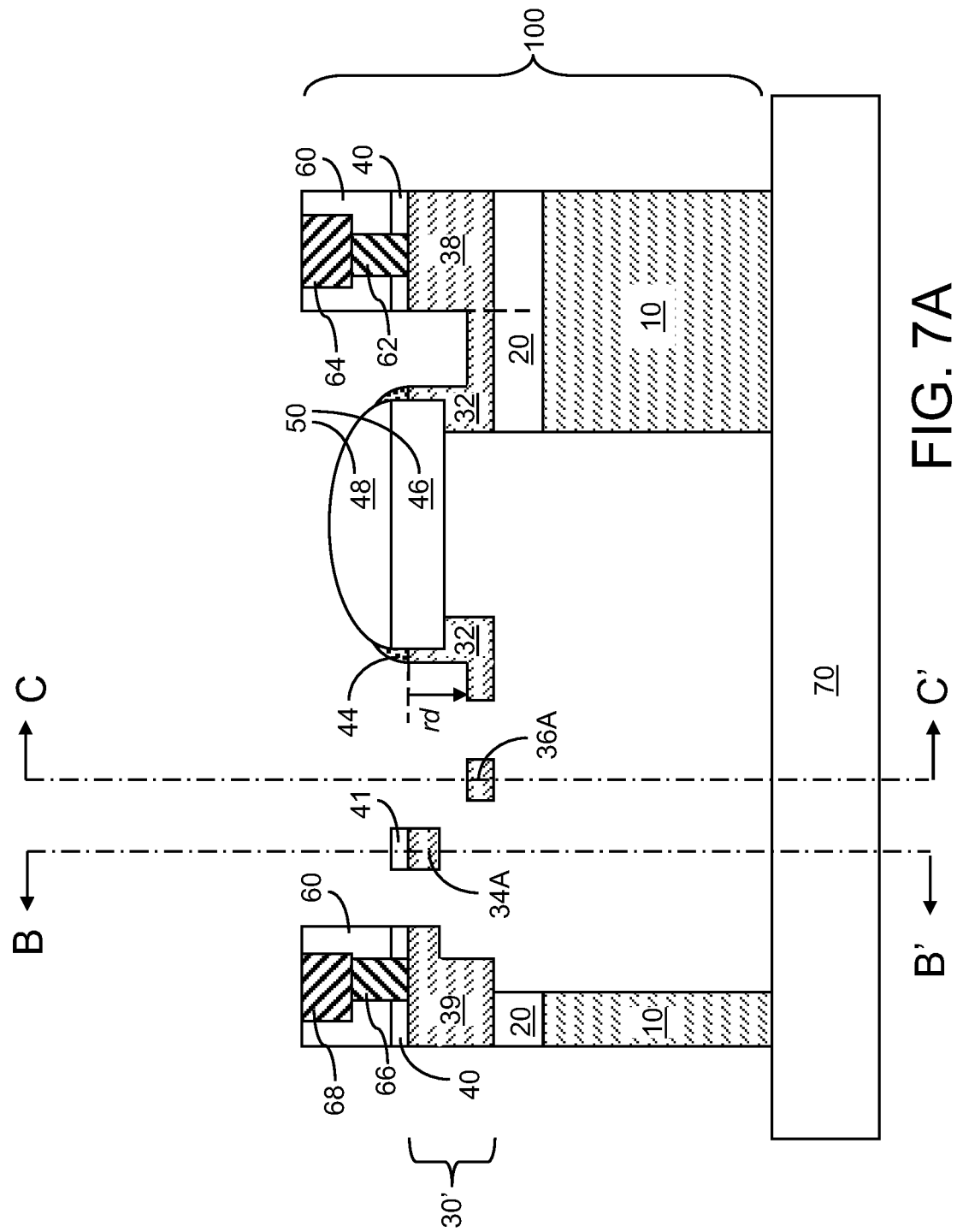

Referring to FIGS. 7A-7C, an anisotropic etch that removes the second dielectric material of the second dielectric material portion 42 and the third dielectric material portion 43 selective to the material of the first dielectric material portion 41 is employed. Preferably, the anisotropic etch is selective to the material of the upper microlens portion 48. The second dielectric material portion 42 is removed. A portion of the first prototype semiconductor structure 36' is exposed from underneath the second dielectric material portion 42. The horizontal portion of the third dielectric material portions 43 is removed. A portion of the second prototype semiconductor structure 38' is exposed from underneath the horizontal portion of the third dielectric material portion 43. The second top surface laterally surrounds the microlens 50. The anisotropic etch is stopped before removing the entirety of the third dielectric material portion. The remaining portion of the third dielectric material portion 43 constitutes a dielectric spacer 44. The dielectric spacer 44 comprises the second dielectric material, which may be, for example, a dielectric nitride or dielectric oxynitride such as silicon nitride or silicon oxynitride.

The dielectric spacer 44 abuts, laterally surrounds, and laterally enclosed the microlens 50. The exposed portions of the first prototype semiconductor structure 36' and the second prototype semiconductor structure 38', which are the exposed portions of the patterned top semiconductor layer 30', are anisotropically recessed selective to the first dielectric material of the first dielectric material portion 41 and the upper microlens portion 48 to a recess depth rd that is less than the vertical thickness of the top semiconductor layer 30 (See FIG. 1A).

After the etching, a second horizontal semiconductor beam 36B is formed by a remainder of the portion of the first prototype semiconductor structure 36', which is a portion of the patterned top semiconductor layer 30'. The top surface of the second horizontal semiconductor beam 36 is uniformly recessed from the topmost surface of the patterned top semiconductor layer 30'. The second horizontal semiconductor beam 36A has a second constant vertical thickness t2. The second constant vertical thickness t2 is less than the thickness of the patterned top semiconductor layer 30', and may be from about 5 nm to about 25 μm, and typically from about 50 nm to about 0.5 μm, although lesser and greater thicknesses are also contemplated herein. The non-recessed portion of the first prototype semiconductor structure 36' is herein referred to as a second doped top semiconductor portion 34B.

The second horizontal semiconductor beam 36A and the second doped top semiconductor portion 36B are of integral and unitary construction, and collectively constitute a second horizontal-beam-containing semiconductor structure 36. The second lower metal interconnect structure (262, 264) is resistively connected to the second horizontal-beam-containing semiconductor structure 36, which comprises a doped semiconductor material. The second horizontal-beam-containing semiconductor structure 36 is structurally supported by a portion of the buried insulator layer 20 located underneath.

Further, a lens rim 32 is formed by a remainder of the portion of the second prototype semiconductor structure 38', which is a portion of the patterned top semiconductor layer 30'. The lens rim 32 includes a topmost surface, which vertically abuts the dielectric spacer 44 and is substantially coplanar with the topmost surfaces of the first top surface of the horizontal-beam-containing semiconductor structure 36. The lens rim 32 includes an area including an L-shaped ledge, which is located at the recess depth rd from the topmost surface of the lens rim 30. Preferably, the ledge laterally surrounds the microlens 50. Preferably, the entirety of the lens rim 32 has L-shaped vertical cross-sectional area. A horizontal ledge of the lens rim 32 protrudes outward toward the first horizontal semiconductor beam 34A and the second horizontal semiconductor beam 36A.

The portion of the lens rim 32 above the ledge and above the bottom surface of the microlens 50 is herein referred to as an upper portion of the lens rim 32. The upper portion of the lens rim 32 has a lateral thickness, which is equal to the thickness of the bottommost portion of the dielectric spacer 44. The lateral thickness of the upper portion of the lens rim 32 may be controlled by the thickness of a dielectric material layer that is employed to form the second and third dielectric material portions (42, 43; See FIG. 1A) and the dielectric spacer 44, and may be from about 10 nm to about 600 nm, and typically from about 30 nm to about a 300 nm, although lesser and greater lateral thicknesses are also contemplated herein. The lateral thickness of the upper portion of the lens rim 32 is controlled to render the lens rim 32 flexible, so that the assembly of the microlens 50 and the lens rim 32 may be tilted when force is applied. The bottom portion of the lend rim 32 below the recess depth rd has a thickness that is substantially the same as the second thickness t2, which is the thickness of the second horizontal semiconductor beam 36A.

The non-recessed portion of the second prototype semiconductor structure 38' is herein referred to as a third doped top semiconductor portion 38. The lens rim 32 and the third doped top semiconductor portion 38 are of integral and unitary construction, and electrically connected to each other, and comprise the same material, i.e., a doped semiconductor material. The third lower metal interconnect structure (62, 64) is resistively connected to the third doped top semiconductor portion 38. The third doped top semiconductor portion 38 is structurally supported by a portion of the buried insulator layer 20 located underneath. Only one side of the lens rim 32 is supported by the buried insulator layer 20, and the rest of the lens rim 32 and the microlens 50 laterally protrude from a substantially vertical sidewall of the buried insulator layer 20.

The lens rim 32 abuts, laterally surrounds, and laterally encloses a peripheral portion of said microlens 50. The first horizontal semiconductor beam 34A is included in the patterned top semiconductor layer 30' in proximity to the lens rim 32. The first horizontal semiconductor beam 34A does not abutting the lens rim 32. The second horizontal semiconductor beam 36A is located in the patterned top semiconductor layer 30' in proximity to the lens rim 32. The second horizontal semiconductor beam 36B does not abutting the lens rim 32. Each of the lens rim 32 and the first and second horizontal semiconductor beams (34A, 36A) comprises a doped semiconductor material. The first horizontal semiconductor beam 34A and the second horizontal semiconductor beam 36A are vertically and laterally offset from each other. The first horizontal semiconductor beam 34A includes a top surface that is substantially coplanar with a topmost surface of the patterned top semiconductor layer 30'. The second horizontal semiconductor beam 36A includes a bottom surface that is substantially coplanar with a bottommost surface of the patterned top semiconductor layer 30'.

The lateral spacing between the proximal end of the lens rim 32 and the second horizontal semiconductor beam 3BA is limited only by lithographic constraints, and may be from about 30 nm to about 2 μm, and typically from about 60 nm to about 500 nm, although lesser and greater spacings are also contemplated herein. The proximal end of the lens rim 32 refers to the portion of the lens rim 32 that is closest to the second horizontal semiconductor beam 36A. The lateral spacing between the first horizontal semiconductor beam 34A and the second horizontal semiconductor beam 36A is limited only by overlay tolerance of lithographic processes, and may be from about 30 nm to about 2 μm, and typically from about 60 nm to about 500 nm, although lesser and greater spacings are also contemplated herein. The lateral width of the second horizontal semiconductor beam 36A may be from about 30 nm to about 2 μm, and typically from about 60 nm to about 500 nm, although lesser and greater spacings are also contemplated herein. The lateral width of the first horizontal semiconductor beam 34A may be from about 30 nm to about 10 μm, and typically from about 60 nm to about 500 nm, although lesser and greater spacings are also contemplated herein.

The first and second patterned hard mask layers (6, 8) may be removed to expose a bottom surface of the handle substrate 10. Alternately, the second patterned hard mask layer 8 may be removed selective to the first patterned hard mask layer 6. Yet alternately, the first and second patterned hard mask layers (6, 8) may be maintained on the bottom surface of the handle substrate 10.

A lower transparent layer 70 is attached to the bottom side of the microlens-containing assembly 100, for example, by bonding. The lower transparent layer 70 comprises an optically transparent material such as glass, cellophane, aluminum oxide, etc. The lower transparent layer 70 may be directly attached to the bottom surface of the handle substrate 10, or may be attached to the handle substrate 10 through at least one of the first and second patterned hard mask layers (6, 8). The thickness of the lower transparent layer 70 may be from about 1 μm to about 5 mm, and typically from about 50 μm to about 1 mm, although lesser and greater thicknesses are also contemplated herein.

Figure 8A:
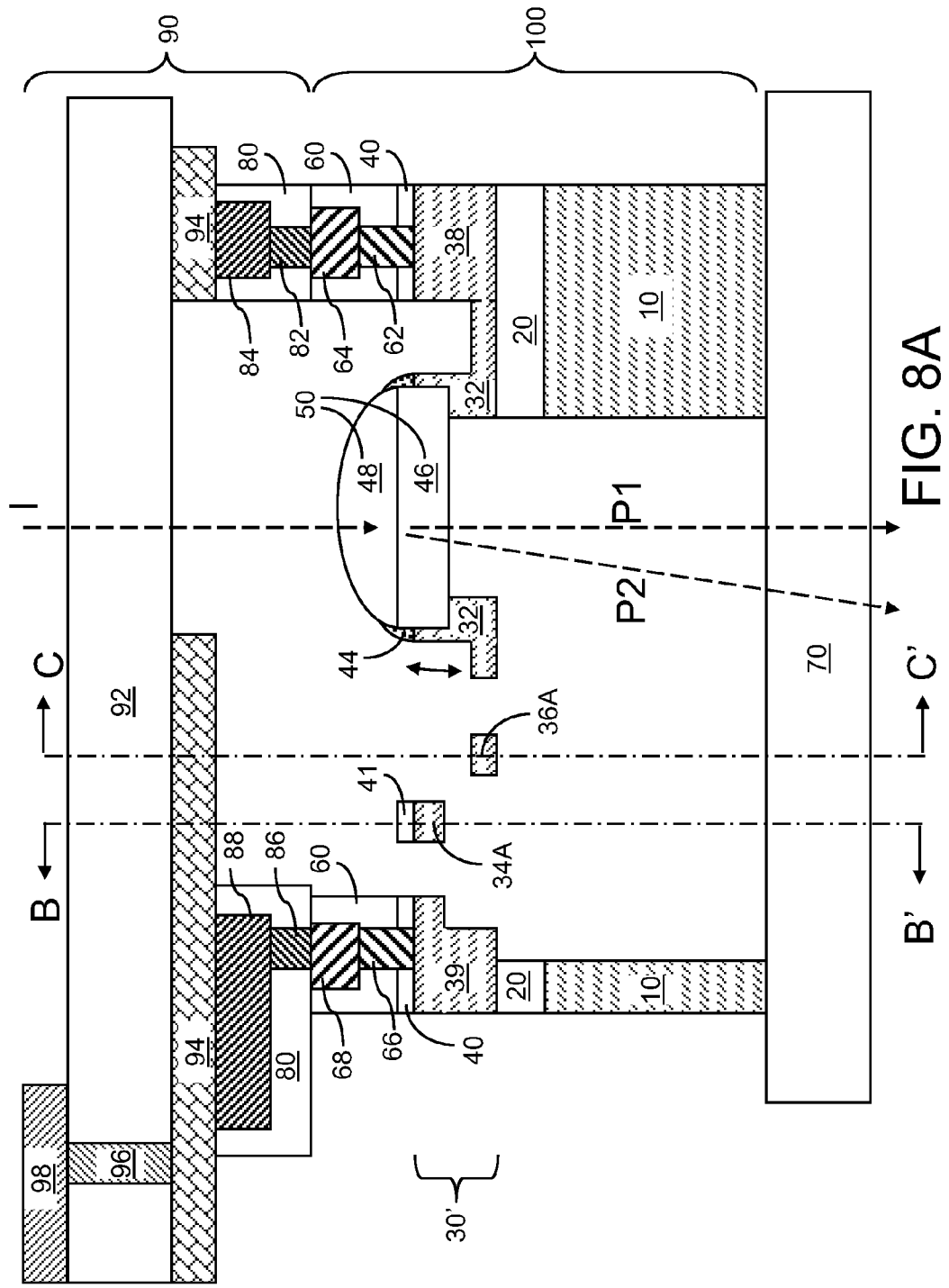

Referring to FIGS. 8A-8C, an upper-transparent-layer-containing assembly 90 is attached to the top side of the micro-lens-containing assembly 100, for example, by bonding. The upper-transparent-layer-containing assembly 90 includes an upper transparent layer 92 which comprises an optically transparent material. The thickness of the upper transparent layer 92 may be from about 50 μm to about 5 mm, and typically from about 200 μm to about 1 mm, although lesser and greater thicknesses are also contemplated herein.

A semiconductor device layer 94 may be formed on the upper transparent layer 92, which comprises a semiconductor substrate including at least one semiconductor device. Preferably, the at least one semiconductor device is configured to provide electrical bias to the first through fourth lower metal interconnect structures. The at least one semiconductor device in the semiconductor device layer 94 may include active devices for controlling electrical signals, or may include only passive devices for routing electrical signals such as metal wiring structures.

Upper metal interconnect structures may be formed on the upper transparent layer 92. For example, a first upper metal interconnect structure may include at least one first upper via structure 182 and at least one first upper metal line 184. A second upper metal interconnect structure may include at least one second upper via structure 282 and at least one second upper metal line 284. A third upper metal interconnect structure may include at least one third upper via structure 82 and at least one third upper metal line 84. A fourth upper metal interconnect structure may include at least one fourth upper via structure 86 and at least one fourth upper metal line 88. Each of the first through fourth upper metal interconnect structures may be embedded in another back-end-of-line (BEOL) dielectric material layer 80, which comprises a dielectric material employed in back-end-of-line semiconductor processing steps.

The upper metal interconnect structures and the lower metal interconnect structures are matched so that paths for electrical signals from the at least one semiconductor device in the semiconductor device layer 94 may be routed to the lens rim 32, the first horizontal semiconductor beam 34A, and the second horizontal semiconductor beam 36A. The first upper metal interconnect structure (182, 184) vertically abuts the first lower metal interconnect structure (162, 164), the second upper metal interconnect structure (282, 284) vertically abuts the second lower metal interconnect structure (262, 264), and the third upper metal interconnect structure (82, 84) vertically abuts the third lower metal interconnect structure (62, 64). Optionally, the fourth upper metal interconnect structure (86, 88) may vertically abut the fourth lower metal interconnect structure (66, 68).

Optionally, at least one through-substrate-via 96 may be provided through the upper transparent layer 92. At least one external interconnect structure 98 may be formed on an outer surface of the upper transparent layer 92 on the opposite side of the micro-lens-containing assembly 100. The assembly of the upper-transparent-layer-containing assembly 90, the micro-lens-containing assembly 100, and the lower transparent layer 70 includes an encapsulated volume within which the microlens 50, the first horizontal semiconductor beam 34A, and the second horizontal semiconductor beam 36A are located. The enclosure of the microlens 50, the first horizontal semiconductor beam 34A, and the second horizontal semiconductor beam 36A provides protection of the structure of the assembly (70, 100, 90) from mechanical shocks and/or the chemical conditions of the ambient.

The first exemplary semiconductor structure constitutes a microlens structure, which is a micro-electro-mechanical system (MEMS) lens that may be operated by electrical means. Specifically, the first exemplary semiconductor structure is configured to let light through the upper transparent layer 92, into the microlens 50, and then through the lower transparent layer 70. Without any electrical bias across the lens rim 32 and any of the first and second horizontal semiconductor beams (34A, 36A), an incident beam I passes through the microlens 50 without any deflection, or tilting through a first path P1. When electrical bias is applied across the lens rim 32 and any of the first and second horizontal semiconductor beams (34A, 36A), the electrostatic force between the lens rim 32 and at least one of the first and second horizontal semiconductor beams (34A, 36A) causes tilting of the microlens 50 along the direction of the bidirectional arrow in FIG. 8A. The path of the incident beam I is altered upon passing through the microlens 50, which is schematically represented by a second path. The electrical bias may be applied between the lens rim 32 and the first horizontal semiconductor beam 34A or between the lens rim 32 and the second horizontal semiconductor beam 36A. Alternately, both the first and second horizontal semiconductor beams (34A, 36A) may be biased relative to the lens rim 32.

Figure 9:
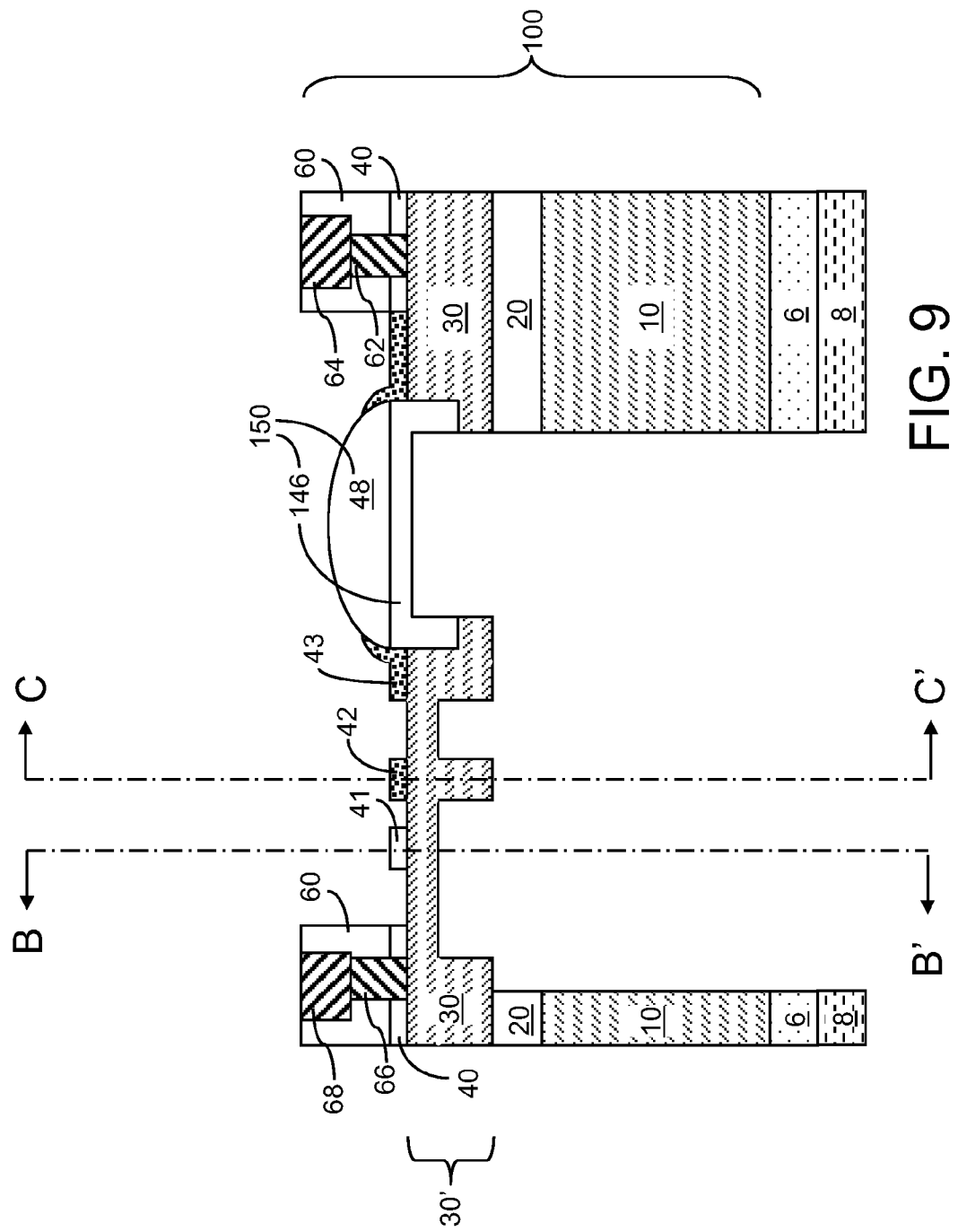
FIGS. 9 and 10 are sequential vertical cross-sectional views of a second exemplary semiconductor structure according to a second embodiment of the present invention.

Referring to FIG. 9, a second exemplary semiconductor structure according to a second embodiment of the present invention is shown at a processing step corresponding to FIGS. 5A-5C. The second exemplary semiconductor structure is derived from the first exemplary semiconductor structure employing the same processing methods of FIGS. 1A-4C. In the second embodiment, the lower microlens portion 46 of the first exemplary semiconductor structure of the first embodiment comprises a material that may be etched concurrently with the etching of the exposed portions of the buried insulator layer 20. For example, the buried insulator layer 20 and the lower microlens portion 46 may comprise the same transparent dielectric material such as silicon oxide. Concurrently with the removal of the buried insulator layer 20, an inner region of the lower microlens portion 46 is removed to form a center-thin lower microlens portion 146. The center-thin lower microlens portion 146 has a center region having a first lower microlens portion thickness and a peripheral region having a second lower microlens portion thickness, which is greater than the first lower microlens portion thickness. The thinning of the center of the center-thin lower microlens portion 146 reduces the weight of the microlens 150, which includes the upper microlens portion 48 and the center-thin lower microlens portion 146. The reduced weight of the microlens 150 allows a greater degree of tilting for the assembly of the microlens 150.

Figure 10:
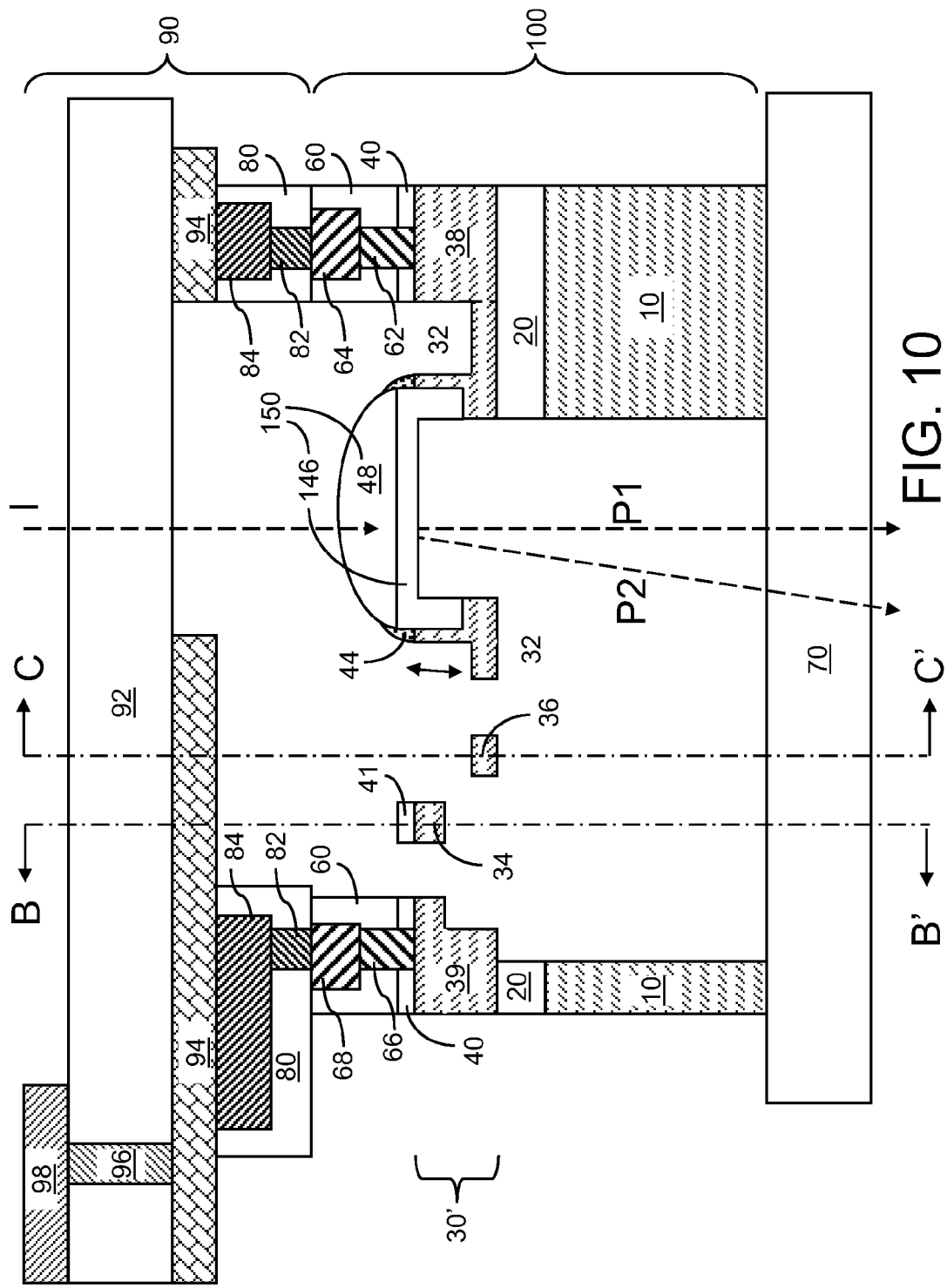

Referring to FIG. 10, the second exemplary semiconductor structure is shown at a processing step corresponding to FIGS. 8A-8C after mounting the upper-transparent-layer-containing assembly 90 and the lower transparent layer 70 as in the first embodiment. The same processing methods may be employed to form the second exemplary semiconductor structure after the processing step corresponding to FIG. 9.

Figure 11:
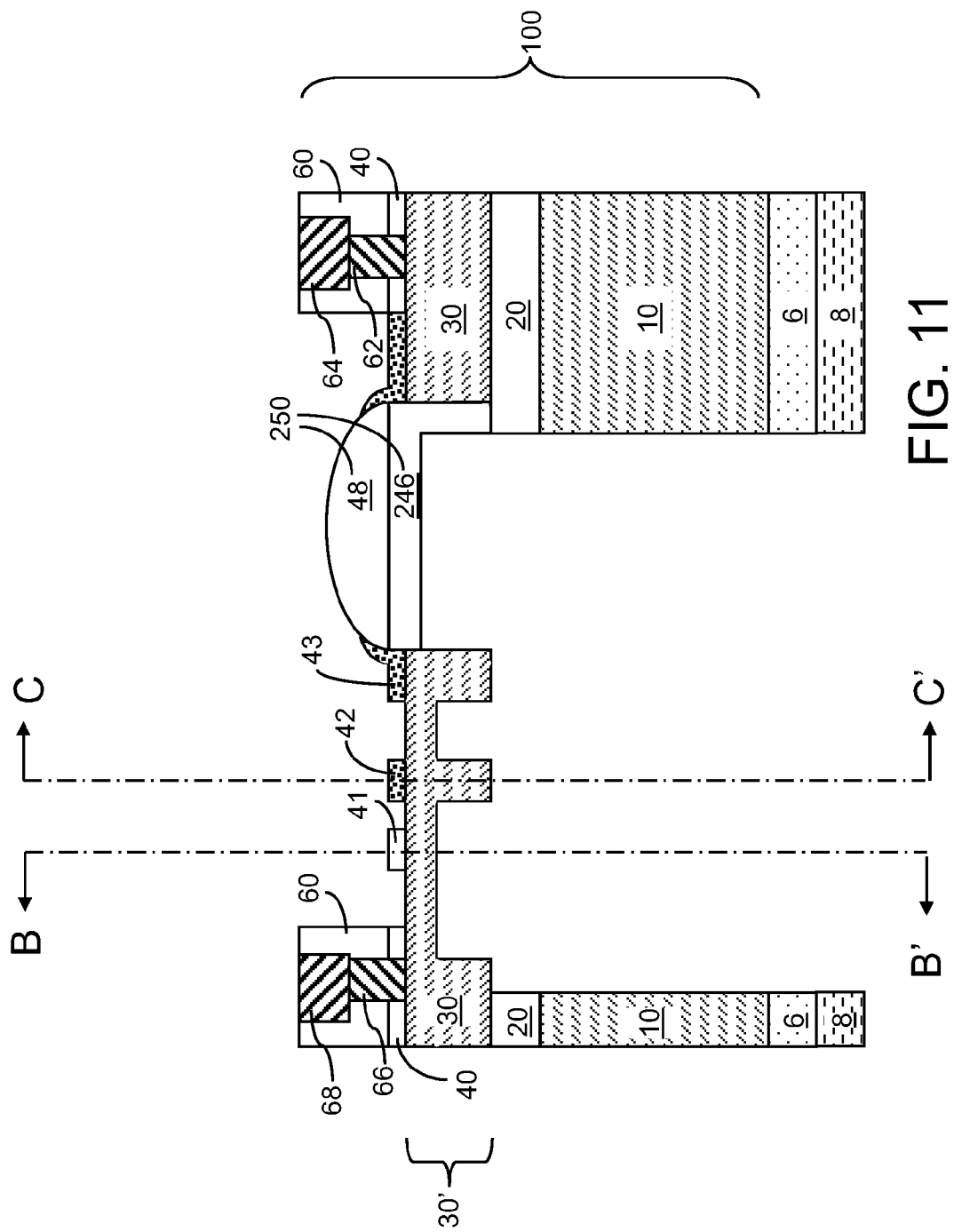
FIGS. 11 and 12 are sequential vertical cross-sectional view of a third exemplary semiconductor structure according to a third embodiment of the present invention.

Referring to FIG. 11, a third exemplary semiconductor structure according to a third embodiment of the present invention is shown at a processing step corresponding to FIGS. 5A-5C. The third exemplary semiconductor structure is derived from the first exemplary semiconductor structure employing the same processing methods of FIGS. 1A-4C. In the third embodiment, the lower microlens portion 46 extends from the top surface of the top semiconductor layer 30 (See FIG. 1A) to a bottom surface of the top semiconductor layer 30. Further, the lower microlens portion 46 comprises a material that may be etched concurrently with the etching of the exposed portions of the buried insulator layer 20. For example, the buried insulator layer 20 and the lower microlens portion 46 may comprise the same transparent dielectric material such as silicon oxide. Concurrently with the removal of the buried insulator layer 20, the exposed portion of the lower microlens portion 46 is removed to form an asymmetrically thinned lower microlens portion 246. The asymmetrically thinned lower microlens portion 246 has a greater thickness on the side that is supported by the buried insulator layer 20 than the side that is not supported by the buried insulator layer 20. The asymmetrically thinned lower microlens portion 246 reduces the weight of the microlens 250, which includes the upper microlens portion 48 and the asymmetrically thinned lower microlens portion 246. The reduced weight of the microlens 250 allows a greater degree of tilting for the assembly of the microlens 250.

Figure 12:
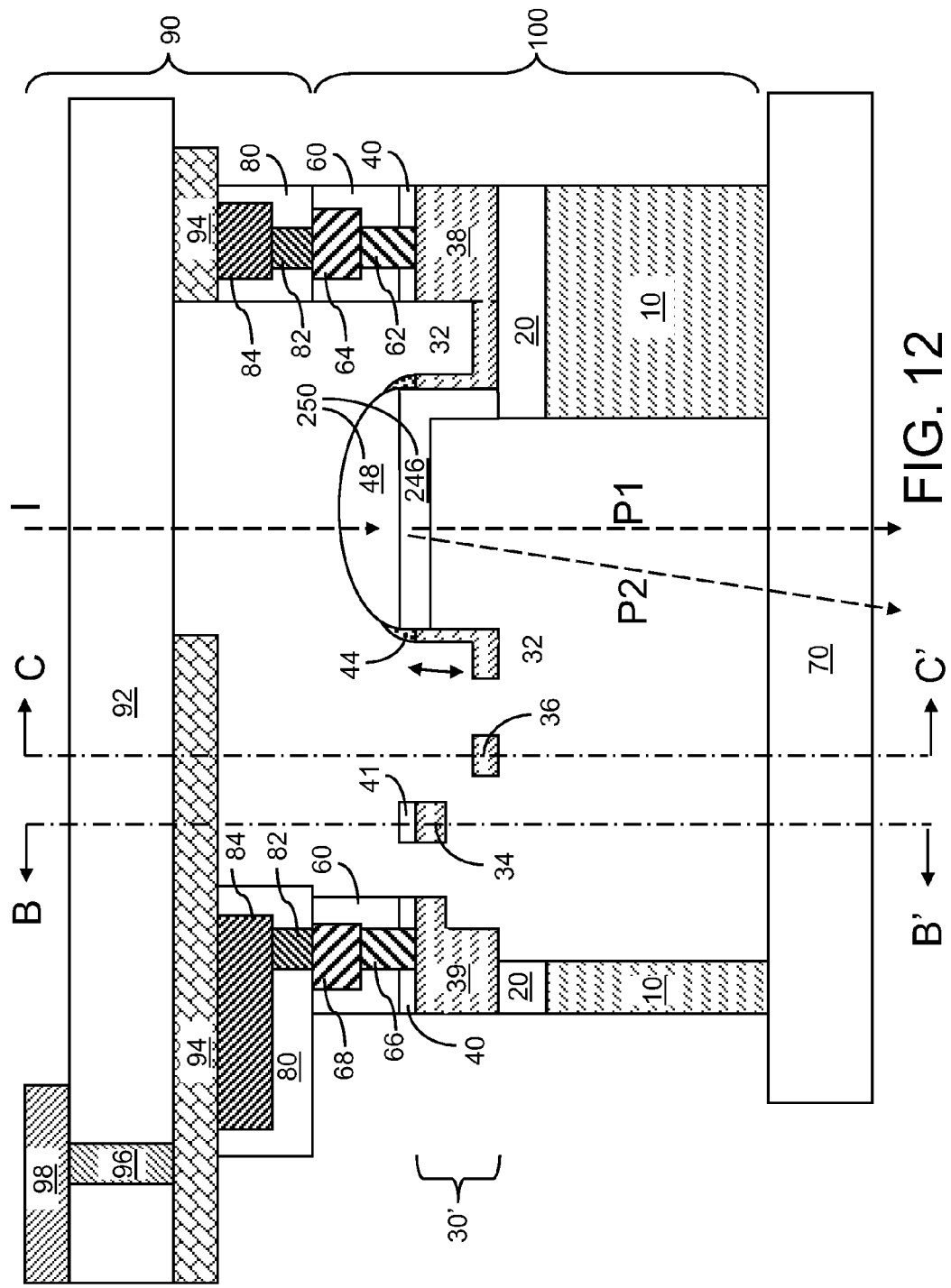

Referring to FIG. 12, the third exemplary semiconductor structure is shown at a processing step corresponding to FIGS. 8A-8C after mounting the upper-transparent-layer-containing assembly 90 and the lower transparent layer 70 as in the first embodiment. The same processing methods may be employed to form the second exemplary semiconductor structure after the processing step corresponding to FIG. 11.

Figure 13:
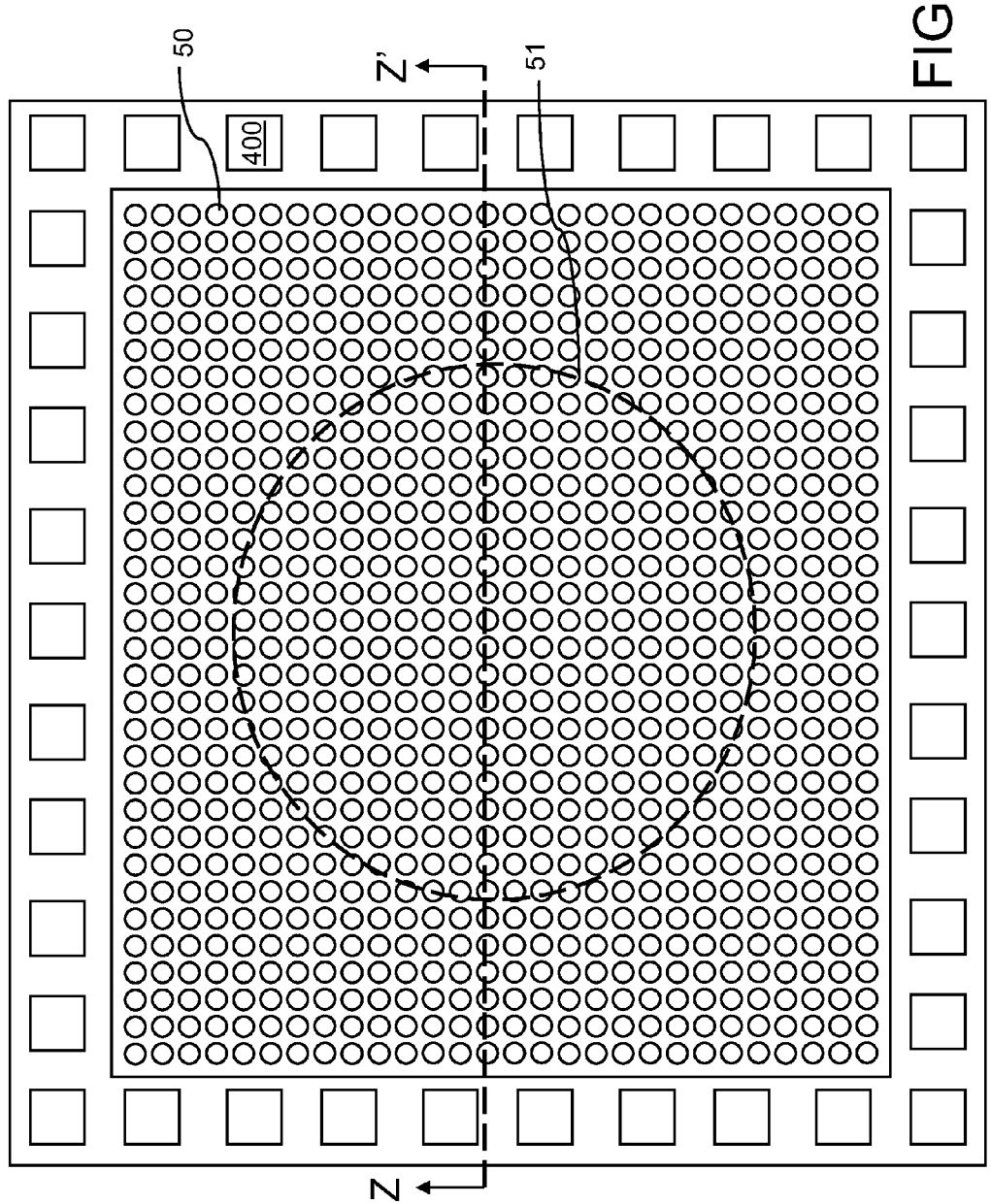
FIG. 13 is a top-down view of an exemplary array of microlens structures according to a fourth embodiment of the present invention.

Referring to FIG. 13, an exemplary array of microlens structures is shown in a schematic top-down view according to a fourth embodiment of the present invention. Each microlens structure in the exemplary array of microlens structures may be any of the first through third exemplary semiconductor structures described above, i.e., may be the assembly of the upper-transparent-layer-containing assembly 90, the micro-lens-containing assembly 100, and the lower transparent layer 70. For clarity, however, only a microlens 50 is schematically shown to represent each microlens structure that in actuality includes an assembly (90, 100, 70). The exemplary array of microlens structures is configured so that light beam through each microlens structure in the array converges at a same focal point, which is variable. In other words, the exemplary array of microlens structures has a variable focal point.

Figure 14:
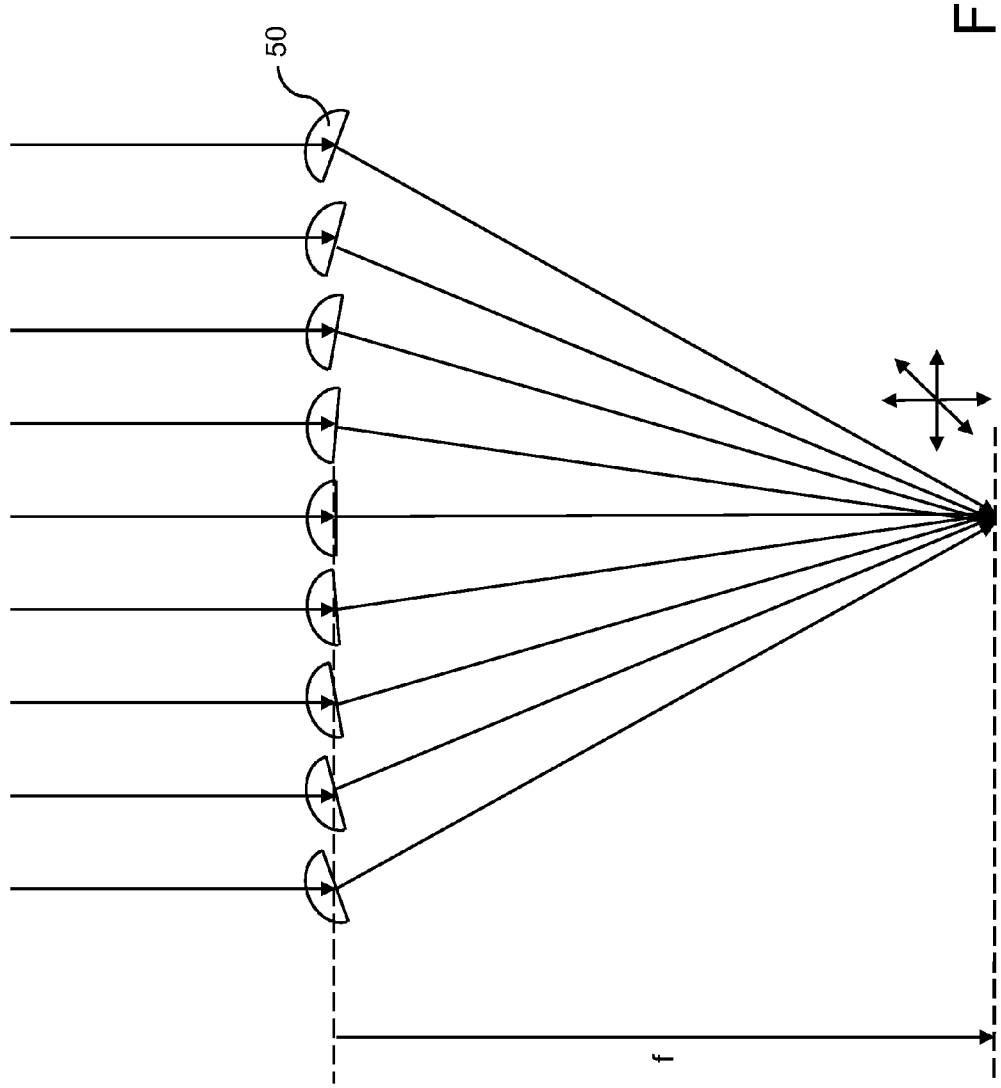
FIG. 14 is a schematic vertical cross-sectional view of the exemplary array of microlens structures along the vertical plane Z-Z' in FIG. 13.

Referring to FIG. 14, a schematic vertical cross-sectional view of the exemplary array of microlens structures is shown along the vertical plane Z-Z' in FIG. 13. To maintain a variable focal point, the microlenses 50 are tilted at different angles so that all beams converge at the variable focal point, which is vertically offset from the plane of the exemplary array of microlens structures by a focal length f. The variable focal point may be shifted vertically or laterally. The capability to shift the variable focal point of the exemplary array of microlens structures in any of the x, y, and z coordinates, i.e., in any three dimensional direction, is schematically illustrated by three sets of biaxial arrows.

The control of the degree of tilting may be effected by the semiconductor devices in the semiconductor device layer 94, or other semiconductor devices that are attached to the exemplary array of microlens structures. Referring back to FIG. 13, the exemplary array of microlens structures may be mounted to a frame provided with signal pads 400. The signal pads 400 are wired to the individual lens rims 32 and first and second horizontal semiconductor beams (34A, 36A) of FIGS. 8A-8C, 10, and 12.

The direction of the tilt of each microlens 50 may be controlled by placing each microlens structure in an orientation that allows tilting of a microlens 50 along a radial direction. For example, for a set of microlens structures located on a circle from a microlens structure located at the center of the exemplary array, the direction of the first and second horizontal semiconductor beams (34A, 36A) may be tangential so that the tilting of the microlens 50 and the optical beam may be radial.

Other embodiments in which the direction of the tilt of the microlenses 50 in the array of microlens structures are explicitly contemplated herein. For example, the directions of the tilt of the microlenses 50 may be configured to enable shifting of the variable focal point in any predetermined direction or to form multiple variable focal points. In general, the direction of the tile of the microlenses 50 may be set to achieve any optical effects enabled by at least one variable focal point.

Figure 15:
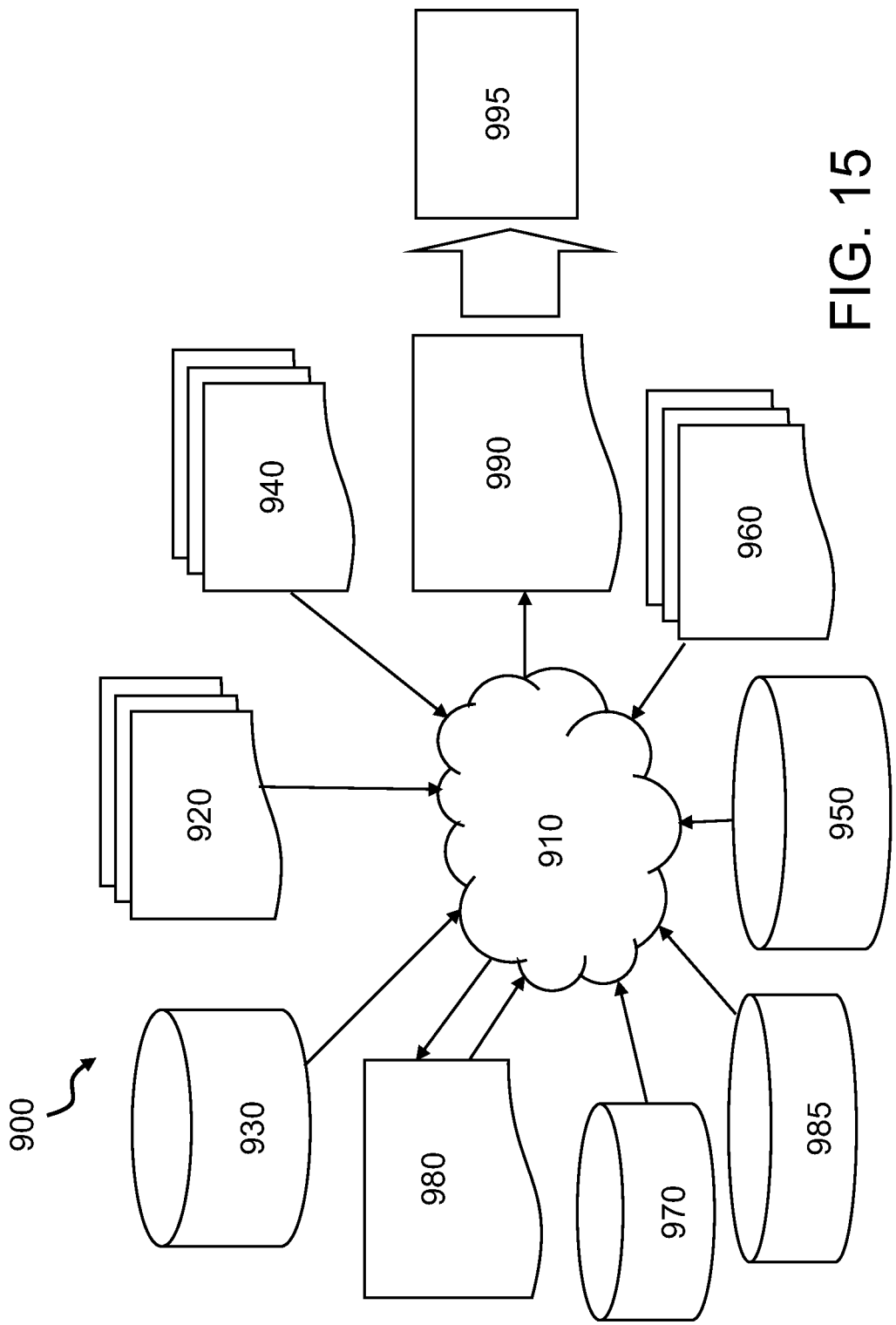
FIG. 15 is a flow diagram of a design process that may be used in design and manufacture of the semiconductor circuits according to the present invention.

FIG. 15 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-14. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 15 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A structure comprising:
   a semiconductor-on-insulator (SOI) substrate including a patterned top semiconductor layer, a buried insulator layer, and a handle substrate;
   a microlens located on said patterned top semiconductor layer and comprising an optically transparent material and having a convex or concave surface;
   a lens rim abutting a peripheral portion of said microlens and comprising a doped semiconductor material; and
   a first horizontal semiconductor beam included in said patterned top semiconductor layer and located in proximity to said lens rim, but not abutting said lens rim and comprising a doped semiconductor material.

2. The structure of claim 1, further comprising a second horizontal semiconductor beam located in said patterned top semiconductor layer and located in proximity to said lens rim, but not abutting said lens rim and comprising a doped semiconductor material, and wherein said second horizontal semiconductor beam is vertically and laterally offset from said first horizontal semiconductor beam.

3. The structure of claim 2, wherein said first horizontal semiconductor beam includes a top surface that is substantially coplanar with a topmost surface of said patterned top semiconductor layer, and wherein said second horizontal semiconductor beam includes a bottom surface that is substantially coplanar with a bottommost surface of said patterned top semiconductor layer.

4. The structure of claim 2, further comprising:
   a first doped top semiconductor portion located in said patterned top semiconductor layer, wherein said first doped semiconductor portion and said first horizontal semiconductor beam are of integral and unitary construction;
   a second doped top semiconductor portion located in said patterned top semiconductor layer, wherein said second doped semiconductor portion and said second horizontal semiconductor beam are of integral and unitary construction; and a third doped top semiconductor portion located in said patterned top semiconductor layer, wherein said third doped top semiconductor portion and said lens rim are of integral and unitary construction.

5. The structure of claim 4, wherein each of said first doped top semiconductor portion, said second doped top semiconductor portion, and said third doped top semiconductor portion abut said buried insulator layer and has a top surface that is substantially coplanar with a topmost surface of said patterned top semiconductor layer.

6. The structure of claim 4, further comprising:

a first assembly of at least one first metal interconnect structure, wherein said first assembly vertically abuts said first doped top semiconductor portion;

a second assembly of at least one second metal interconnect structure, wherein said second assembly vertically abuts said second doped top semiconductor portion; and a third assembly of at least one third metal interconnect structure, wherein said third assembly vertically abuts said third doped top semiconductor portion.

7. The structure of claim 6, further comprising an upper transparent layer overlying said microlens and a lower transparent layer underlying said microlens, wherein said upper transparent layer and said lower transparent layer are attached to said SOI substrate.

8. The structure of claim 7, further comprising a semiconductor device layer including at least one semiconductor device configured to apply electrical voltages to each of said lens rim and said first and second horizontal semiconductor beams.

9. The semiconductor structure of claim 8, wherein said semiconductor device layer vertically abuts said upper transparent layer and each of said first, second, and third assemblies.

* * * * *